(12) United States Patent
Kim et al.

(10) Patent No.: US 10,673,006 B2
(45) Date of Patent: Jun. 2, 2020

(54) ORGANIC LIGHT EMITTING DEVICE AND DISPLAY DEVICE INCLUDING THE SAME

(71) Applicant: Samsung Display Co., Ltd., Yongin-si, Gyeonggi-do (KR)

(72) Inventors: Sung Wook Kim, Hwaseong-si (KR); Sung-Soo Bae, Seoul (KR); Hye In Jeong, Suwon-si (KR); Dong Hyun Kim, Seongnam-si (KR); Seul Ong Kim, Hwaseong-si (KR); Tsuyoshi Naijo, Suwon-si (KR); Hwan Hee Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/957,667

(22) Filed: Apr. 19, 2018

(65) Prior Publication Data
US 2019/0088896 A1 Mar. 21, 2019

(30) Foreign Application Priority Data
Sep. 20, 2017 (KR) .................. 10-2017-0121288

(51) Int. Cl.
*H01L 51/56* (2006.01)
*H01L 27/32* (2006.01)
(Continued)

(52) U.S. Cl.
CPC ............ *H01L 51/506* (2013.01); *B82Y 10/00* (2013.01); *H01L 51/5004* (2013.01);
(Continued)

(58) Field of Classification Search
CPC .............. H01L 51/506; H01L 51/5004; H01L 27/3244; H01L 51/56; H01L 51/5012; H01L 2251/552
(Continued)

(56) References Cited

U.S. PATENT DOCUMENTS

| 7,074,500 B2 | 7/2006 | Pfeiffer et al. |
| 2009/0039770 A1* | 2/2009 | Kang et al. ......... H01L 51/5088 313/504 |

(Continued)

FOREIGN PATENT DOCUMENTS

| JP | 6056763 | 1/2017 |
| KR | 10-2012-0004018 | 1/2012 |
| KR | 10-1706680 | 2/2017 |

*Primary Examiner* — Thinh T Nguyen
(74) *Attorney, Agent, or Firm* — Lewis Roca Rothgerber Christie LLP

(57) ABSTRACT

An organic light emitting device includes: a first electrode; a second electrode that overlaps the first electrode; and an organic layer that is disposed between the first electrode and the second electrode, wherein the organic layer comprises a hole transport region that includes a hole transport material and a p-dopant, and wherein when a doping amount of the p-dopant doped to the hole transport region exceeds 1 wt %, the following Equation 1 is satisfied, while when the doping amount of the p-dopant is 1 wt % or less than 1 wt %, the following Equation 2 is satisfied:

$$\text{HOMO\_HTM} - \text{LUMO\_}p\text{-dopant} < -0.05 \text{ eV} \quad [\text{Equation 1}]$$

$$\text{HOMO\_HTM} - \text{LUMO\_}p\text{-dopant} > -0.05 \text{ eV} \quad [\text{Equation 2}]$$

In Equation 1 and Equation 2, HOMO_HTM denotes HOMO energy of the hole transport material and LUMO_p-dopant denotes LUMO energy of the p-dopant.

8 Claims, 6 Drawing Sheets

(51) Int. Cl.
 *H01L 51/50* (2006.01)
 *B82Y 10/00* (2011.01)
 *H01L 51/00* (2006.01)

(52) U.S. Cl.
 CPC .......... *H01L 51/5012* (2013.01); *H01L 51/56* (2013.01); *H01L 27/3244* (2013.01); *H01L 51/006* (2013.01); *H01L 51/0051* (2013.01); *H01L 51/0072* (2013.01); *H01L 2251/552* (2013.01)

(58) Field of Classification Search
 USPC ............. 257/40, 72, 81; 438/48, 128, 82, 99
 See application file for complete search history.

(56) References Cited

U.S. PATENT DOCUMENTS

| | | | |
|---|---|---|---|
| 2014/0339529 A1 | 11/2014 | Tani et al. | |
| 2017/0346037 A1* | 11/2017 | Huang et al. | H01L 51/5234 |
| 2018/0331300 A1* | 11/2018 | Fadhel et al. | H01L 51/0071 |
| 2018/0337339 A1* | 11/2018 | Senkovskyy | H01L 51/0052 |

* cited by examiner

ORGANIC LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2017-0121288, filed in the Korean Intellectual Property Office on Sep. 20, 2017, the entire content of which is incorporated herein by reference.

BACKGROUND

1. Field

The present disclosure relates to an organic light emitting device and a display device including the same.

2. Description of the Related Art

An organic light emitting device as a self-light emitting device has enhanced features of a large viewing angle, excellent contrast, and/or a fast response time, and is capable of representing various colors, compared to a conventional device.

The organic light emitting device may have a structure in which a first electrode is disposed on a substrate, and a hole transport region, an emission layer, an electron transport region, and a second electrode are sequentially formed on the first electrode. Holes injected from the first electrode move to the emission layer via the hole transport region, and electrons injected from the second electrode move to the emission layer via the electron transport region. Carriers such as holes and electrons are recombined in an emission region and generate excitons. Light is emitted when the excitons transition from an excited state to a ground state.

The above information disclosed in this Background section is only for enhancement of understanding of the background of the invention and therefore it may contain information that does not form the prior art that is already known to a person of ordinary skill in the art.

SUMMARY

The present invention has been made in an effort to provide an organic light emitting device, and a display device including the same.

An organic light emitting device according to an exemplary embodiment includes: a first electrode; a second electrode that overlaps the first electrode; and an organic layer between the first electrode and the second electrode, wherein the organic layer includes a hole transport region that includes a hole transport material and a p-dopant, and wherein when a doping amount of the p-dopant doped to the hole transport region exceeds 1 wt %, the following Equation 1 is satisfied, and when the doping amount of the p-dopant is 1 wt % or less than 1 wt %, the following Equation 2 is satisfied:

$$\text{HOMO\_HTM} - \text{LUMO\_p-dopant} < -0.05 \text{ eV} \qquad \text{Equation 1}$$

$$\text{HOMO\_HTM} - \text{LUMO\_p-dopant} > -0.05 \text{ eV} \qquad \text{Equation 2}$$

wherein, in Equation 1 and Equation 2, HOMO_HTM denotes HOMO energy of the hole transport material and LUMO_p-dopant denotes LUMO energy of the p-dopant.

The hole transport material may satisfy $-5.3 \text{ eV} < \text{HOMO\_HTM} < -4.9 \text{ eV}$, and the p-dopant may satisfy $-5.25 \text{ eV} < \text{LUMO\_p-dopant} < -4.85 \text{ eV}$.

The p-dopant may be included at an amount of about 0.25 wt % to about 20 wt % based on a total content of the hole transport region.

A thickness of the hole transport region including the p-dopant may be about 10 Å to about 300 Å.

The organic light emitting device may further include an emission layer, and recombination of holes and electrons in the emission layer may be generated adjacent to the hole transport region.

When the doping amount of the p-dopant in the hole transport region exceeds 1 wt %, and when an absolute value of a difference between the HOMO_HTM and the LUMO_p-dopant is increased, light emission efficiency of the organic light emitting device may be increased.

When the doping amount of the p-dopant is 1 wt % or less than 1 wt %, and when a doping concentration of the p-dopant is decreased, light emission efficiency of the organic light emitting device may be increased.

Light emission efficiency of the organic light emitting device may be increased as a thickness of the hole transport region that includes the p-dopant is decreased.

A display device according to an exemplary embodiment includes: a transistor on a substrate; and an organic light emitting device connected with the transistor, wherein the organic light emitting device includes: a first electrode; a second electrode that overlaps the first electrode; and an organic layer between the first electrode and the second electrode, wherein the organic layer includes an electron transport region, a hole transport region, and an emission layer where holes and electrons are recombined, the emission layer including a first region adjacent to the hole transport region and a second region adjacent to the electron transport region. The holes and the electrons are recombined in the first region of the emission layer more than the second region of the emission layer.

The organic light emitting device according to the exemplary embodiments may have high efficiency, high luminance, and long life-span.

DETAILED DESCRIPTION

Figure 1:
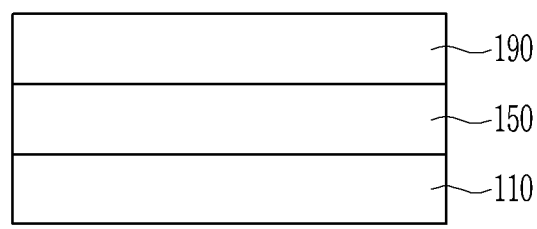
FIG. 1 is a schematic illustratration of a structure of an organic light emitting device according to an exemplary embodiment.

Hereinafter, exemplary embodiments of the present invention will be described in more detail with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises," "comprising," "include," "includes," or "including" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

Hereinafter, an organic light emitting diode according to an exemplary embodiment will be described with reference to FIG. 1. FIG. 1 is a schematic cross-sectional view of the organic light emitting diode according to the exemplary embodiment.

An organic light emitting diode includes a first electrode 110, an organic layer 150, and a second electrode 190.

A substrate may be additionally provided below the first electrode 110 or above the second electrode 190. As the substrate, a glass substrate or a plastic substrate having excellent mechanical strength, thermal stability, transparency, surface flatness, ease of handling, and water resistance may be utilized.

The first electrode 110 may be formed by depositing or sputtering a material on the substrate, but the present invention is not limited thereto. When the first electrode 110 is an anode, the material may be selected from materials having a high work function. In such a case, holes can be easily injected through the first electrode 110.

The first electrode 110 may be a reflective electrode, a transflective electrode, or a transmissive electrode. In order to form the first electrode 110 as a transmissive electrode, the material utilized to form the first electrode 110 may be selected from indium tin oxide (ITO), indium zinc oxide (IZO), tin oxide ($SnO_2$), zinc oxide (ZnO), and combinations thereof, but the present invention is not limited thereto. In order to form the first electrode 110 as a transflective electrode or a reflective electrode, the material utilized to form the first electrode 110 may be selected from magnesium (Mg), aluminum (Al), aluminum-lithium (Al—Li), calcium (Ca), magnesium-indium (Mg—In), magnesium-silver (Mg—Ag), and combinations thereof, but the present invention is not limited thereto.

The first electrode 110 may have a single-layered structure or a multi-layered structure having a plurality of layers. For example, the first electrode 110 may have a three-layered structure of ITO/Ag/ITO, but the present invention is not limited thereto.

The organic layer 150 is disposed on the first electrode 110. The organic layer 150 includes an emission layer. The organic layer 150 may include a hole transport region disposed between the first electrode 110 and the emission layer, and an electron transport region disposed between the emission layer and the second electrode 190.

The hole transport region may have the following structures: i) a single-layered structure of a single layer formed of a single material; ii) a single-layered structure of a single layer formed of a plurality of different materials; or iii) a multi-layered structure formed of a plurality of layers, each formed of a plurality of different materials.

The hole transport region may include at least one selected from a hole injection layer HIL, a hole transport layer HTL, an auxiliary emission layer, and an electron blocking layer (EBL).

For example, the hole transport region may have a single-layered structure of a single layer that is made of a plurality of different materials, or a multi-layered structure of hole injection layer/hole transport layer, hole injection layer/hole transport layer/auxiliary emission layer, hole injection layer/auxiliary emission layer, hole transport layer/auxiliary emission layer, or hole injection layer/hole transport layer/electron blocking layer, sequentially stacked from the first electrode 110, but the present invention is not limited thereto.

The hole transport region may include a hole transport material and a p-dopant. The hole transport region according to the exemplary embodiment of the present invention may satisfy the following Equation 1 and Equation 2. Specifically, when an amount of the p-dopant doped in the hole transport region exceeds 1 wt %, Equation 1 may be satisfied, and when an amount of a p-dopant is 1 wt % or less than 1 wt %, Equation 2 may be satisfied.

$$\text{HOMO\_HTM} - \text{LUMO\_}p\text{-dopant} < -0.05 \text{ eV} \qquad \text{Equation 1}$$

$$\text{HOMO\_HTM} - \text{LUMO\_}p\text{-dopant} > -0.05 \text{ eV} \qquad \text{Equation 2}$$

In Equation 1 and Equation 2, HOMO_HTM denotes the highest occupied molecular orbital (HOMO) energy of the hole transport material, and HOMO energy of the hole transport material satisfies $-5.3 \text{ eV} < \text{HOMO\_HTM} < -4.9 \text{ eV}$. In Equation 1 and Equation 2, the LUMO_p-dopant is the lowest unoccupied molecular orbital (LUMO) energy of the p-dopant doped (e.g., injected) into the hole transport region, and LUMO energy of the p-dopant satisfies $-5.25 \text{ eV} < \text{LUMO\_}p\text{-dopant} < -4.85 \text{ eV}$.

Here, in the hole transport region according to the exemplary embodiment, the HOMO energy of the hole transport material may satisfy $-5.3 \text{ eV} < \text{HOMO\_HTM} < -4.9 \text{ eV}$. As an absolute value of the HOMO energy of the hole transport material is increased, excessive injection of holes into the emission layer can be prevented or reduced. Because an appropriate level (e.g., amount) of holes can be injected into the emission layer, an injection amount of holes and an injection amount of electrons into the emission layer are balanced, thereby increasing luminous efficiency.

LUMO energy supplied to the hole transport region may satisfy $-5.25 \text{ eV} < \text{LUMO\_}p\text{-dopant} < -4.85 \text{ eV}$. When the absolute value of the LUMO energy of the p-dopant supplied to the hole transport region is decreased while satisfying the above-stated range, the injection amount of holes supplied to the emission layer can be controlled. When the absolute value of the LUMO energy of the p-dopant is decreased, a difference with a constant HOMO energy level of the hole transport material may be increased. Accordingly, energy required for holes moving to the emission layer is increased.

That is, an excessive amount of holes can be prevented or substantially prevented from being injected into the emission layer to thereby inject an appropriate level of holes into the emission layer.

When an amount of the p-dopant included in the hole transport region exceeds 1 wt % (i.e., based on a total weight of the hole transport region), the hole transport region that satisfies the above-stated Equation 1 can be provided. Here, as the amount of the p-dopant is increased, an injection amount of holes provided to the emission layer may be increased (e.g., excessively increased). According to the present exemplary embodiment, an inappropriate level of holes can be prevented or substantially prevented from being injected, thereby injecting an appropriate level of holes. Thus, when the amount of the p-dopant included in the hole transport region exceeds 1 wt %, energy required for moving of the holes to the emission layer is controlled to be increased according to Equation 1 to control movement of the holes. Accordingly, the injection amount of holes into the emission layer can be controlled to be at an appropriate level.

On the contrary, when the amount of the p-dopant supplied to the hole transport region is 1 wt % or less than 1 wt %, the hole transport region that satisfies Equation 2 can be provided. When a small amount of the p-dopant is included in the hole transport region, the amount of the p-dopant is small even through energy required for holes moving to the emission layer is low such that the injection amount of holes into the emission layer can be controlled.

A method of manufacturing an organic light emitting device may include forming a first electrode; forming a second electrode overlapping with the first electrode; and forming an organic layer between the first electrode and the second electrode, wherein the organic layer comprises a hole transport region, the hole transport region including a hole transport material and a p-dopant, wherein the forming of the organic layer includes: determing a doping amount of the p-dopant in the hole transport region, and selecting the hole transport material according to the doping amount of the p-dopant, wherein when the doping amount of the p-dopant in the hole transport region exceeds 1 wt %, the hole transport material is selected to satisfy the following Equation 1, and when the doping amount of the p-dopant is 1 wt % or less than 1 wt %, the hole transport material is selected to satisfy the following Equation 2:

$$\text{HOMO\_HTM} - \text{LUMO\_}p\text{-dopant} < -0.05 \text{ eV} \qquad \text{[Equation 1]}$$

$$\text{HOMO\_HTM} - \text{LUMO\_}p\text{-dopant} > -0.05 \text{ eV} \qquad \text{[Equation 2]}$$

In Equation 1 and Equation 2, HOMO_HTM denotes HOMO energy of the hole transport material and LUMO_p-dopant denotes LUMO energy of the p-dopant.

In this case, the amount of the p-dopant supplied to the hole transport region according to the exemplary embodiment of the present invention may be about 0.25 wt % to about 20 wt % with respect to (i.e., based on) a total amount (i.e., total weight) of the hole transport region.

Meanwhile, a thickness of the hole transport region may be about 300 Å or less and may be greater than or equal to about 10 Å. When the thickness of the hole transport region exceeds about 300 Å, the injection amount of holes to the emission layer may be excessively increased due to a large thickness of the hole transport region, and when the thickness of the hole transport region is about 10 Å or less, the injection amount of holes to the emission layer is too small such the light emission may hardly occur.

When the thickness of the hole transport region (for example, including the hole injection layer HIL, and the hole transport layer HTL) satisfies the above-stated range, a satisfactory hole transport characteristic can be acquired without causing an actual increase of a driving voltage.

The hole transport region may include at least one hole transport material selected from m-MTDATA, TDATA, 2-TNATA, NPB(NPD), β-NPB, TPD, Spiro-TPD, Spiro-NPB, metalized-NPB, TAPC, HMTPD, TCTA (4,4',4"-tris (N-carbazolyl)triphenylamine), Pani/DBSA (polyaniline/dodecylbenzenesulfonic acid), PEDOT/PSS(poly(3,4-ethylenedioxythiophene)/poly(4-styrenesulfonate) (poly(3, 4-ethylenethiophene)/poly (4-styrenesulfonate))), Pani/CSA (polyaniline/camphor sulfonic acid), PANI/PSS (polyaniline/poly(4-styrenesulfonate)), a compound represented by Chemical Formula 201, and a compound represented by Chemical Formula 202.

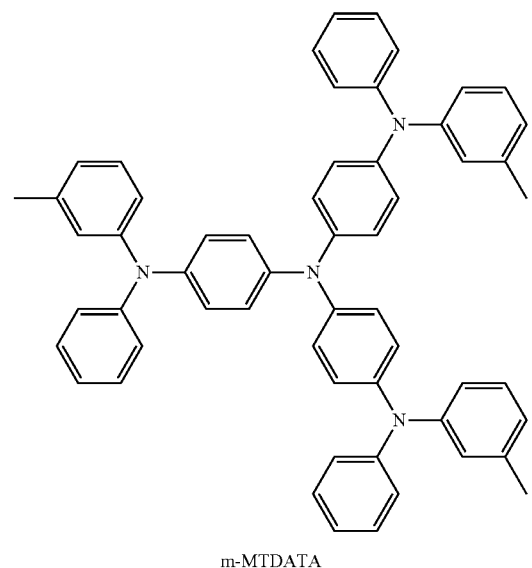

m-MTDATA

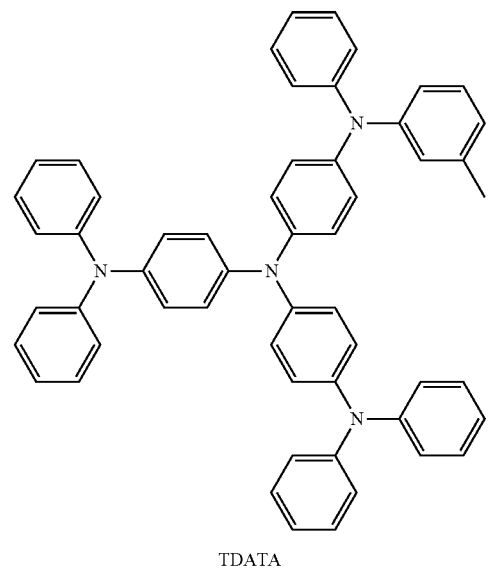

TDATA

-continued
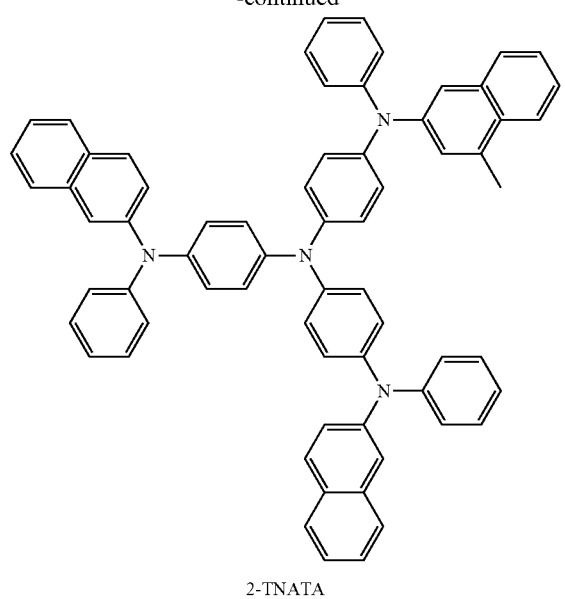
2-TNATA
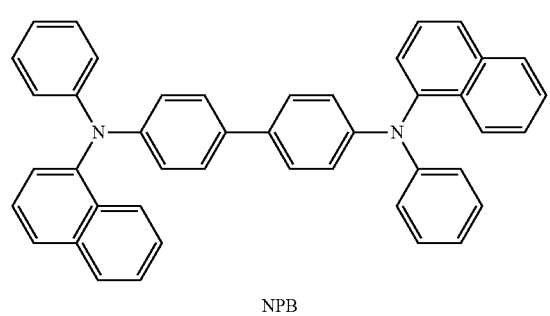
NPB
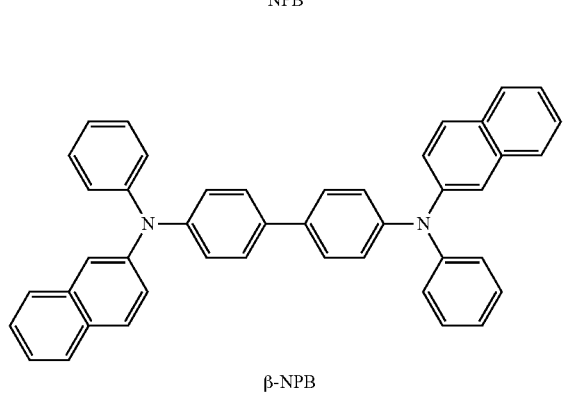
β-NPB
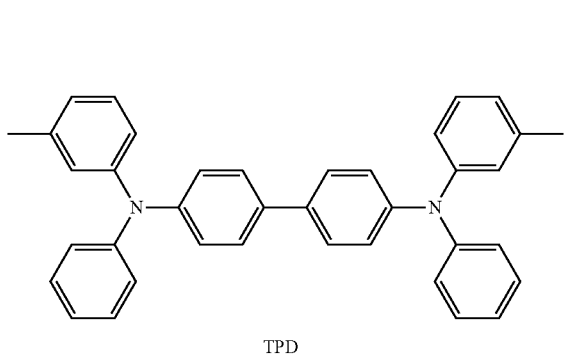
TPD
-continued
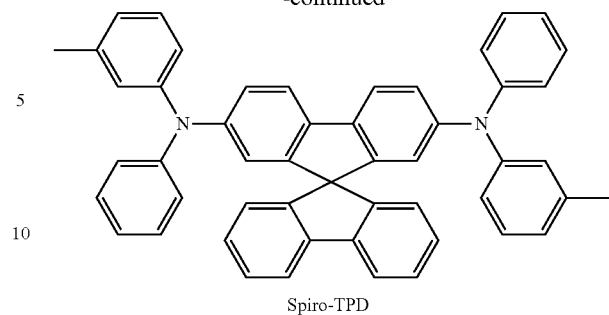
Spiro-TPD
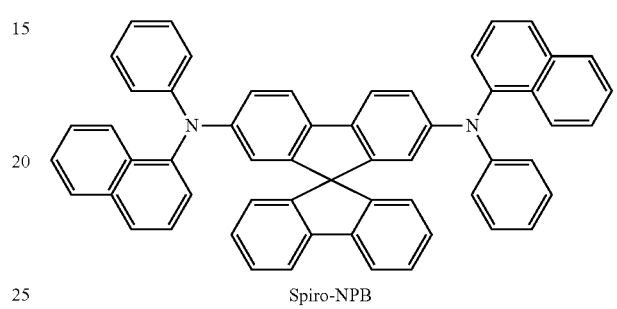
Spiro-NPB
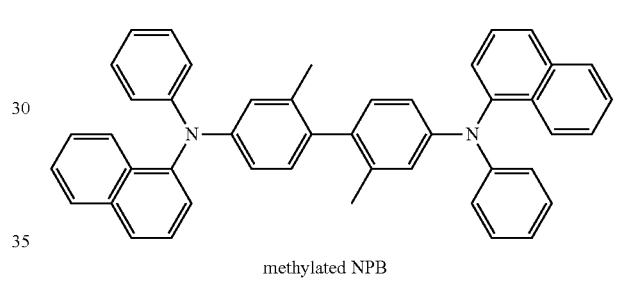
methylated NPB
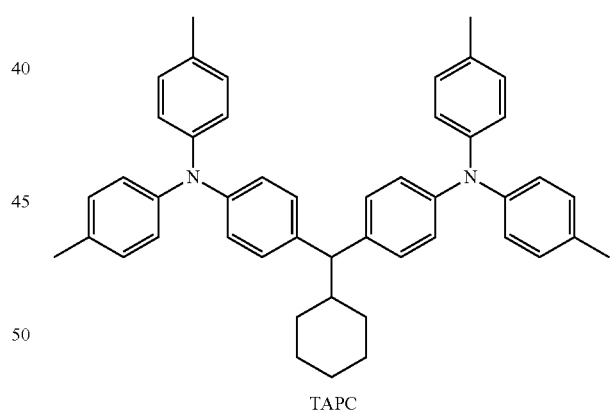
TAPC
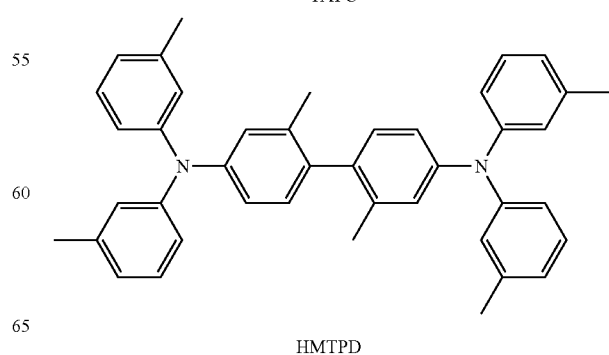
HMTPD Chemical Formula 201

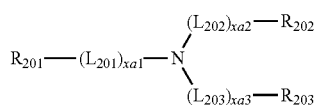

Chemical Formula 202

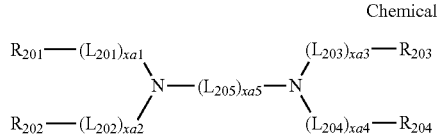

In Chemical Formula 201 and Chemical Formula 202, $L_{201}$ to $L_{204}$ may be each independently selected from a substituted or non-substituted (i.e., unsubstituted) $C_3$-$C_{10}$ cycloalkylene group, a substituted or non-substituted $C_1$-$C_{10}$ heterocycloalkylene group, a substituted or non-substituted $C_3$-$C_{10}$ cycloalkenyl group, a substituted or non-substituted $C_1$-$C_{10}$ heterocycloalkenyl group, a substituted or non-substituted $C_6$-$C_{60}$ arylene group, a substituted or non-substituted $C_1$-$C_{60}$ heteroarylene group, a substituted or non-substituted divalent non-aromatic condensed polycyclic group, and a substituted or unsubstituted divalent non-aromatic hetero-condensed polycyclic group. $L_{205}$ may be selected from *—O—*', *—S—*', *—N $Q_{201}$-*', a substituted or unsubstituted $C_1$-$C_{20}$ alkylene group, a substituted or unsubstituted $C_3$-$C_{10}$ cycloalkylene group, a substituted or unsubstituted $C_1$-$C_{10}$ heterocycloalkenyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a divalent non-aromatic hetero-condensed polycyclic group. xa1 to xa4 may be each independently selected from integers of 0 to 3. xa5 may be selected from integers of 1 to 10. $R_{201}$ to $R_{204}$ and $Q_{201}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkylene group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group.

The hole transport region may include at least one selected from compound HT1 to compound HT43, but the present invention is not limited thereto.

HT1

HT2

HT3

HT4
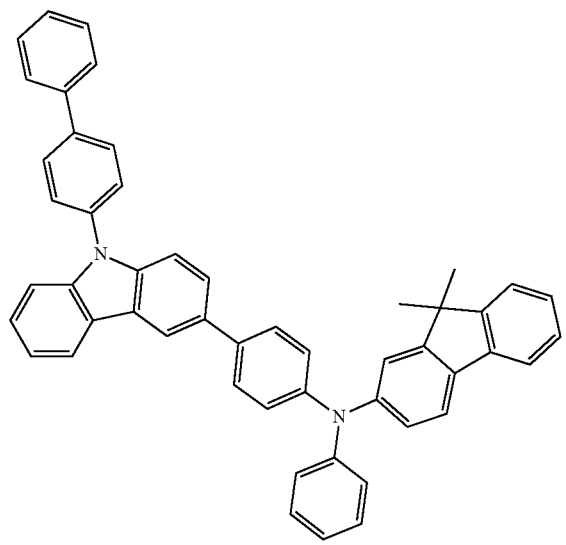
HT5
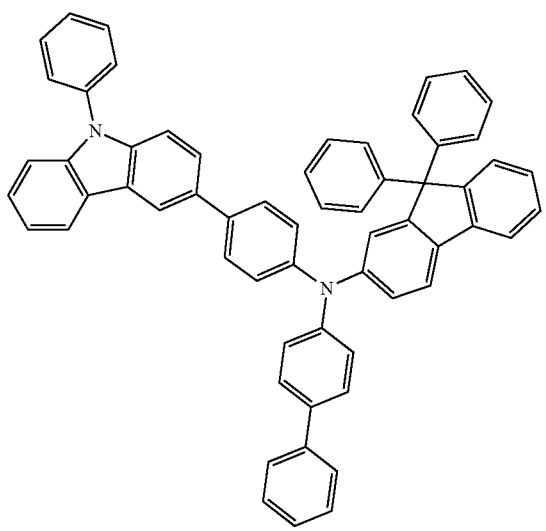
HT6
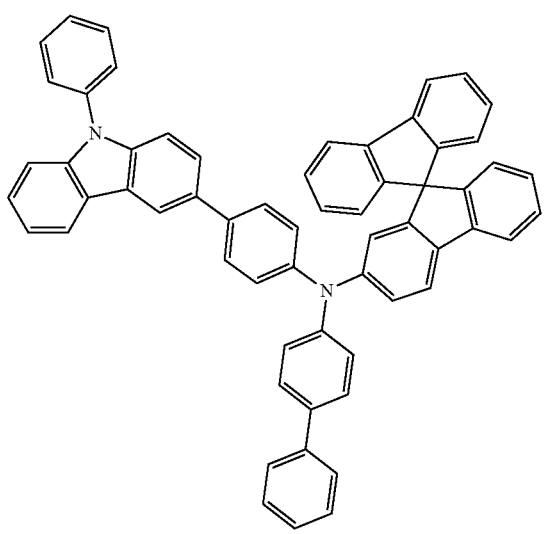
HT7
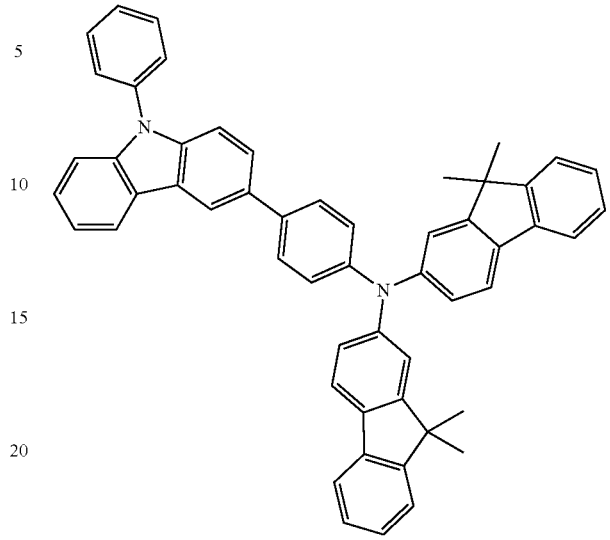
HT8
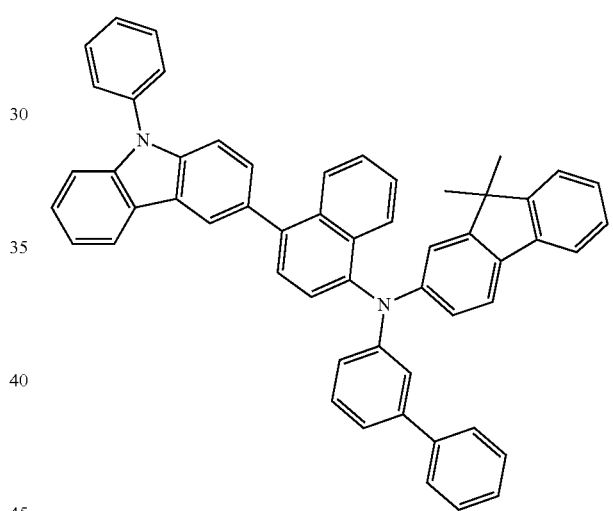
HT9
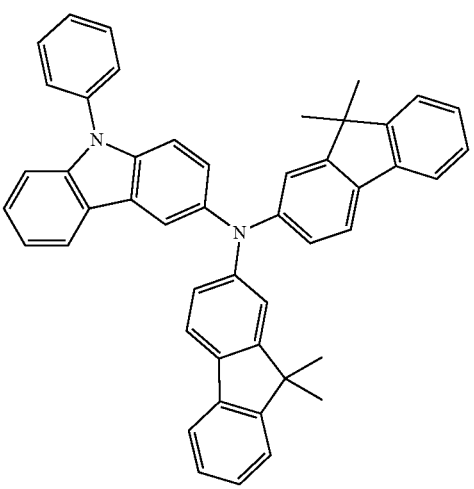

HT10
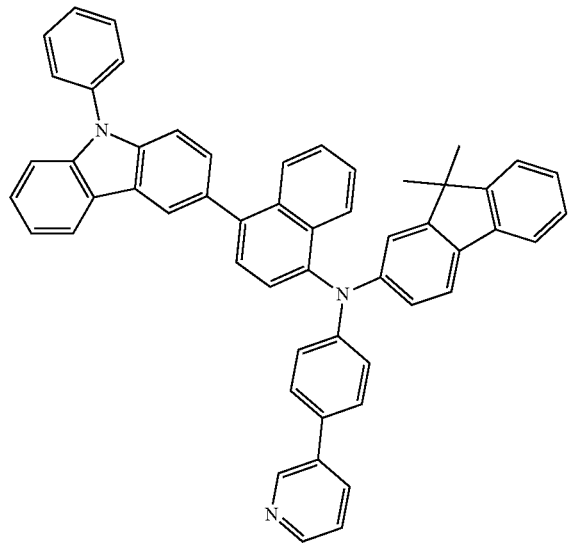
HT11
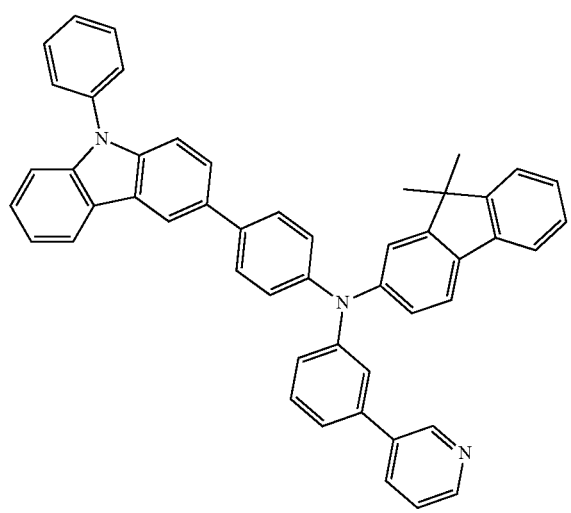
HT12
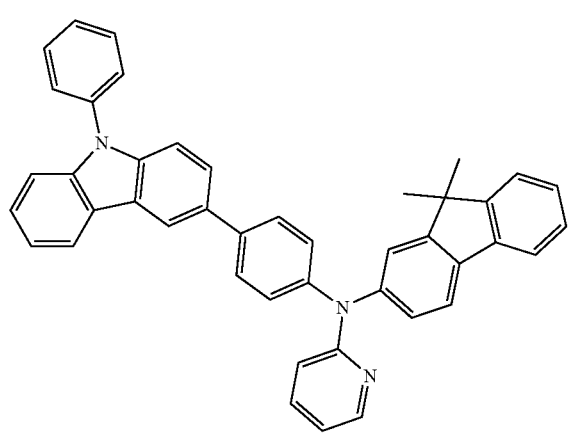
HT13
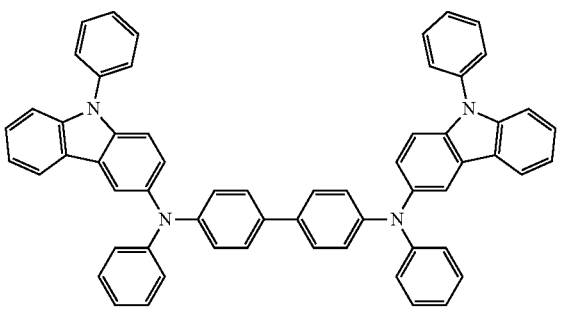
HT14
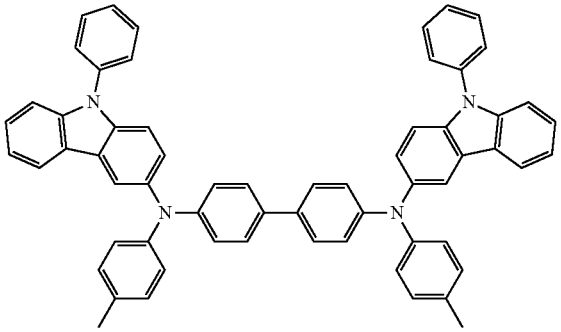
HT15
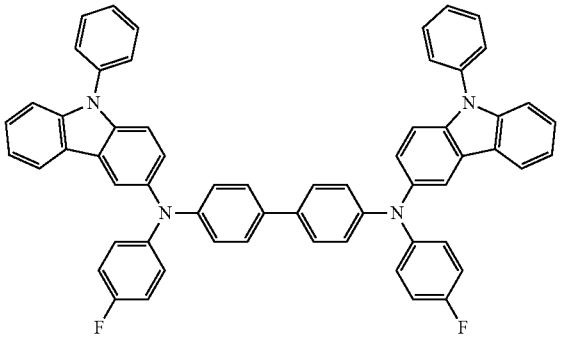
HT16
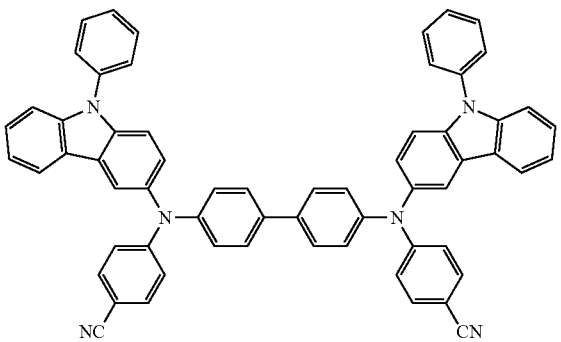

HT17
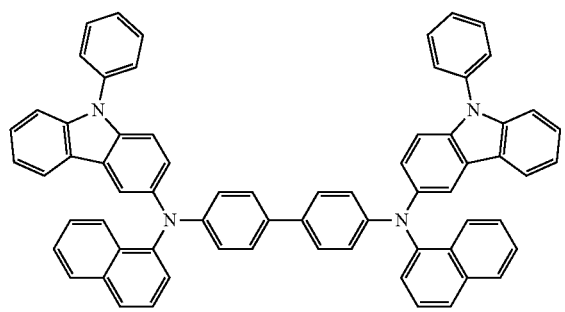
HT18
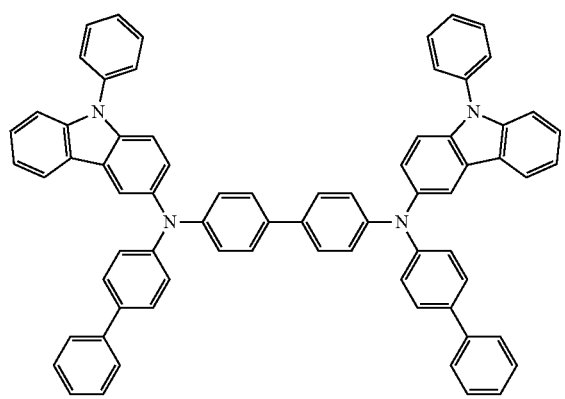
HT19
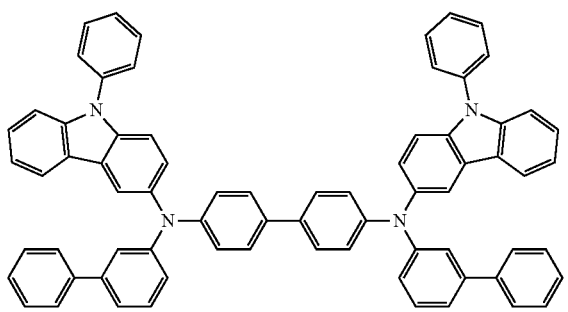
HT20
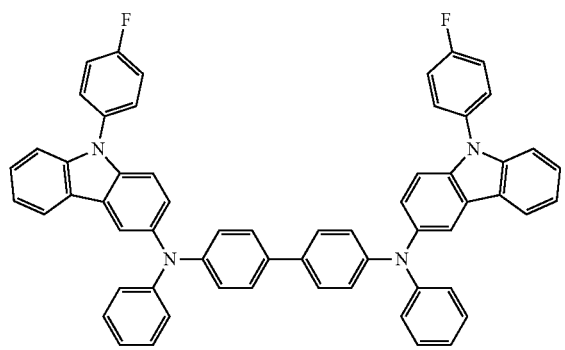
HT21
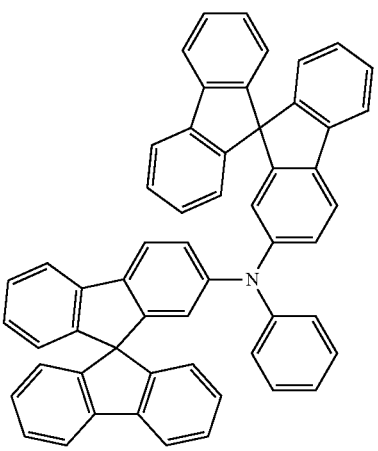
HT22
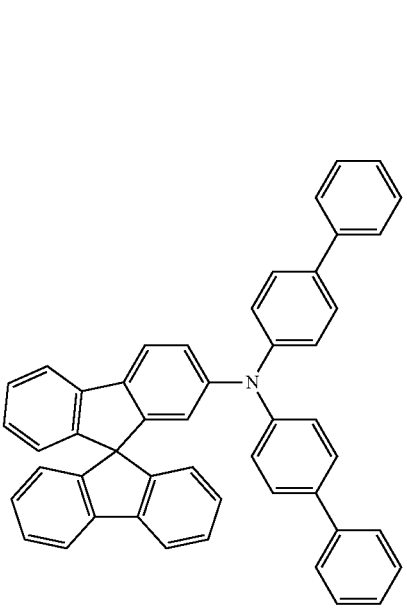
HT23
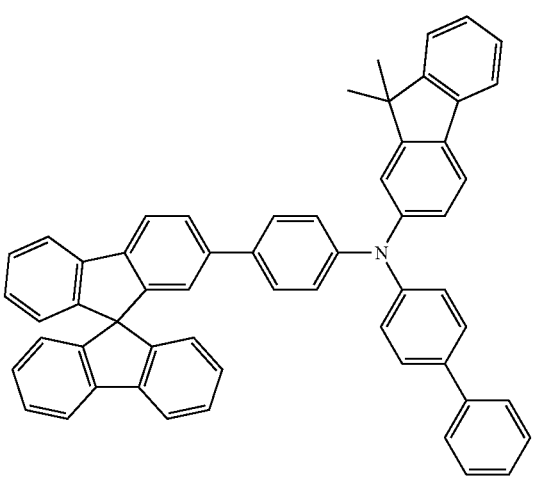

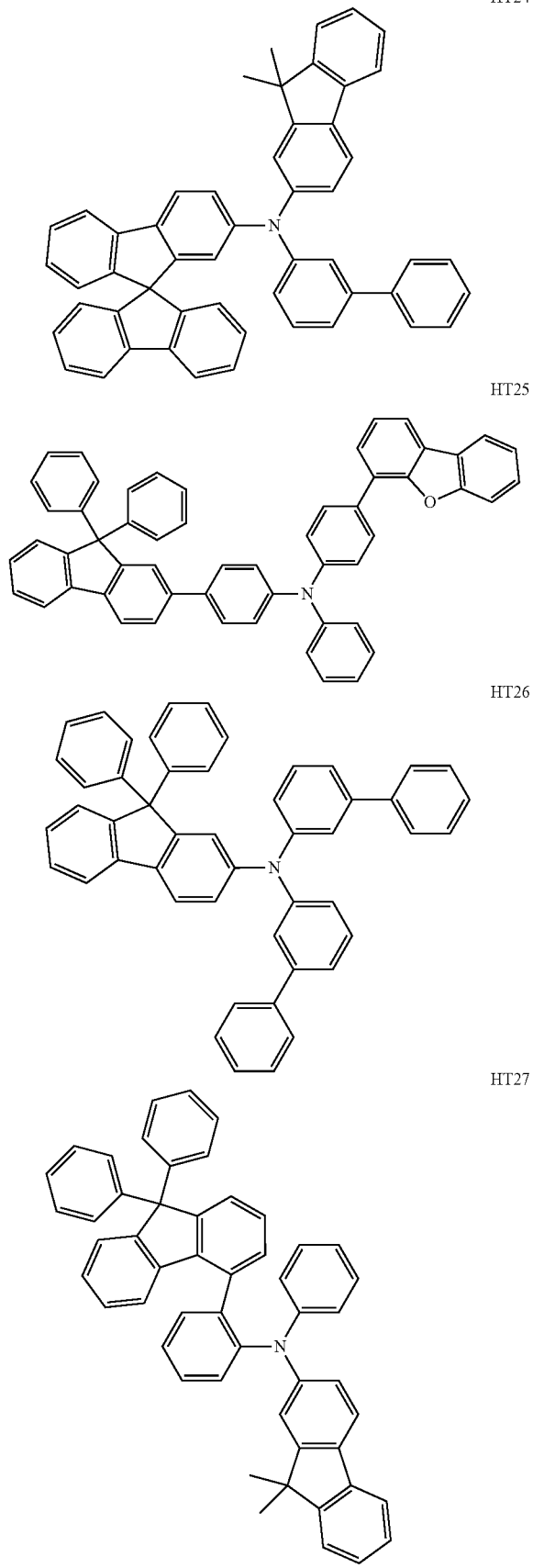
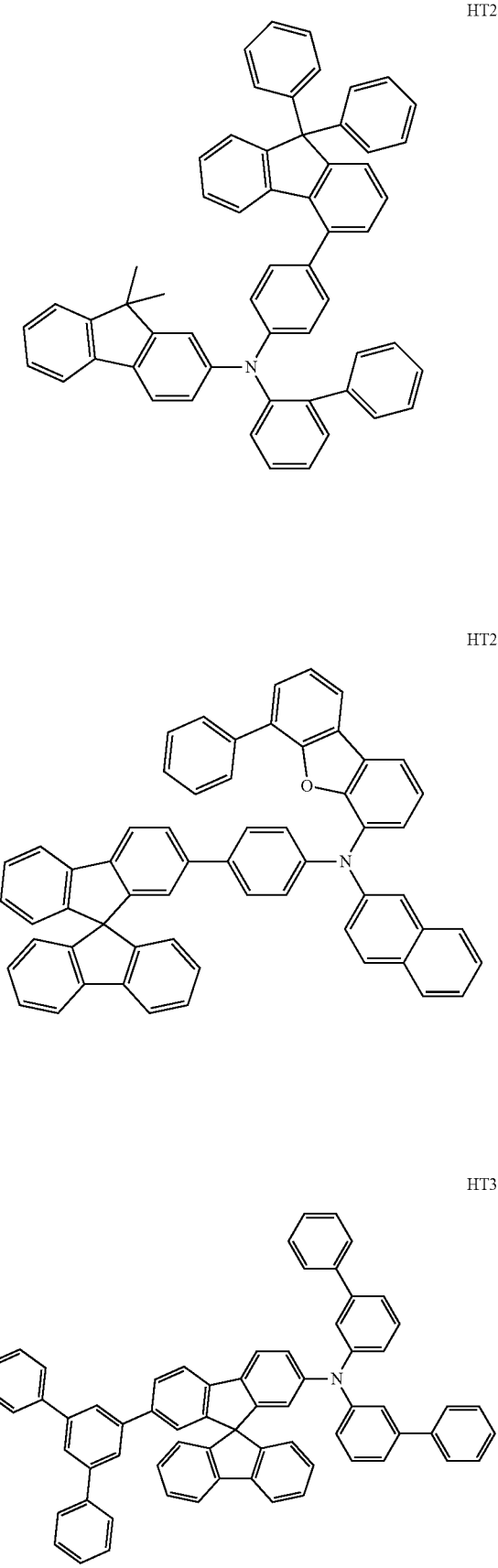

HT31 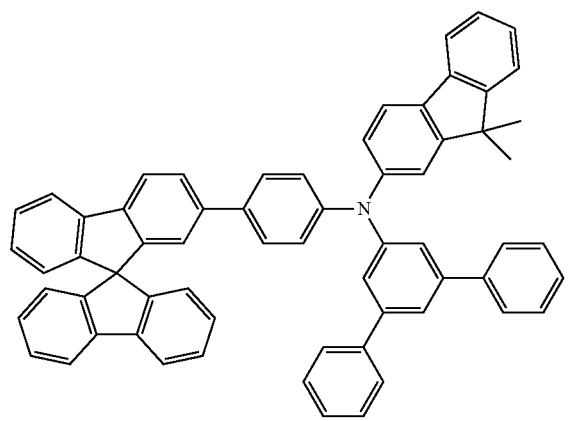
HT32 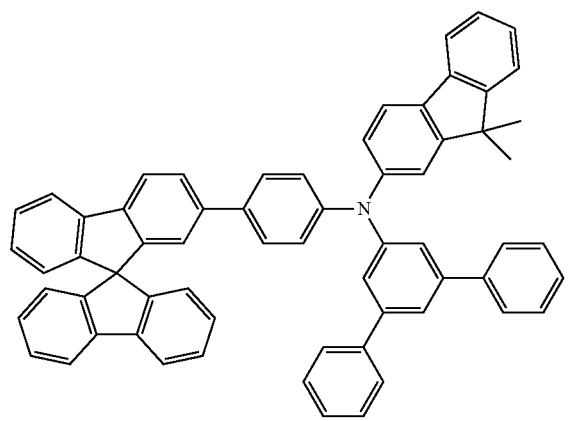
HT33 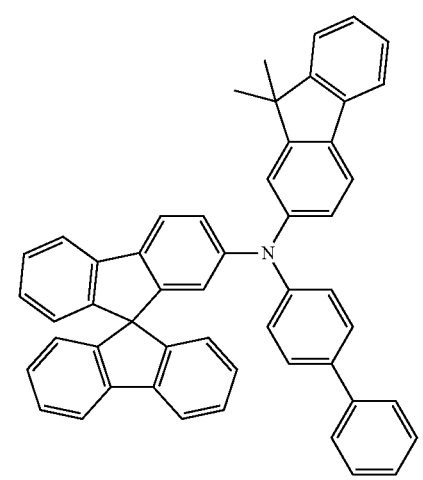
HT34 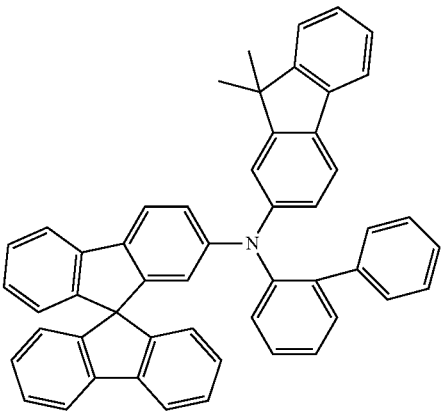
HT35 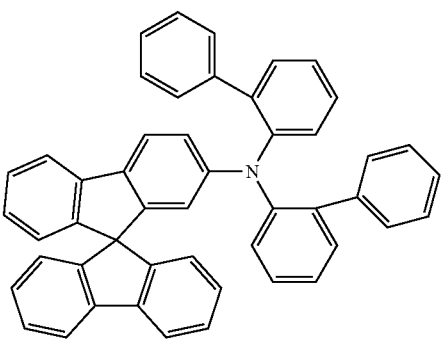
HT36 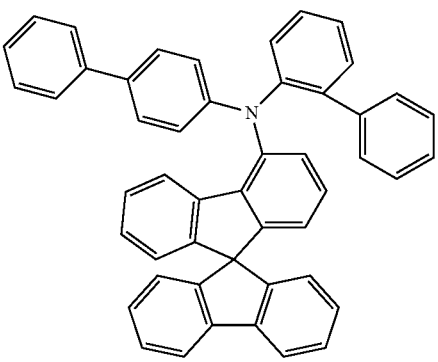
HT37 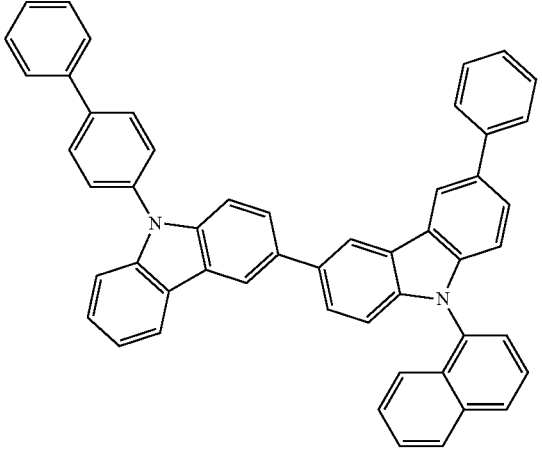

HT38

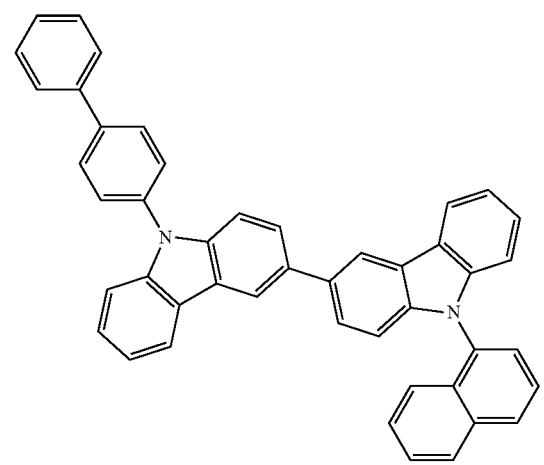

HT39

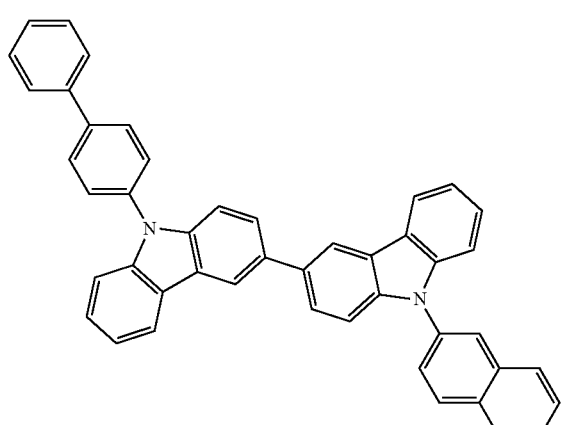

HT40

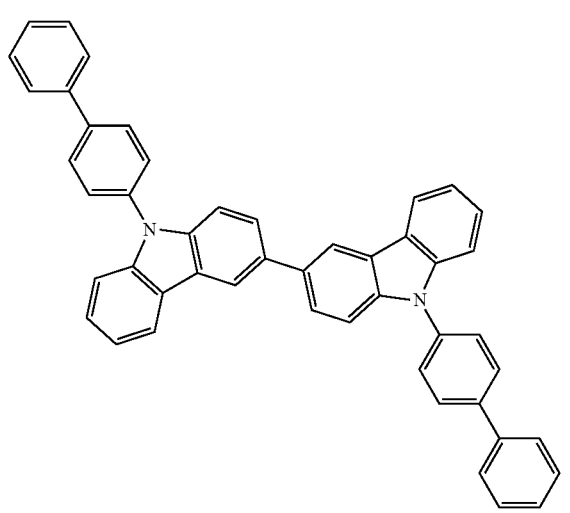

HT41

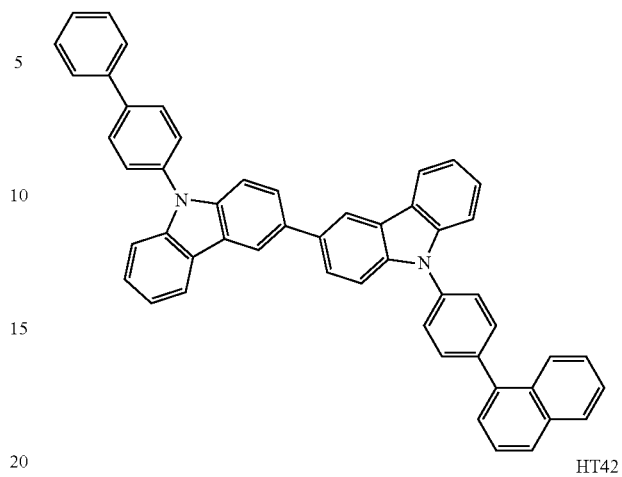

HT42

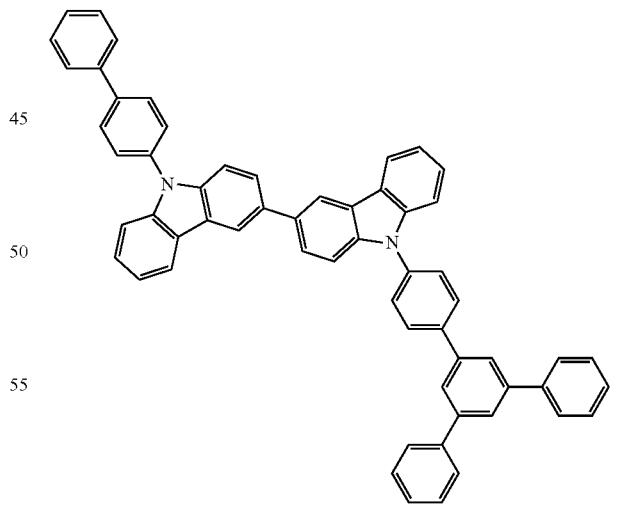

HT43

The auxiliary emission layer (i.e., auxiliary light emission layer) serves to increase light emission efficiency by compensating an optical resonance distance according to a wavelength of light emitted from the emission layer, and the electron blocking layer serves to prevent or reduce electron injection from the electron transport region. The above-stated material may be included in the auxiliary light emission layer and the electron blocking layer.

The hole transport region may further include a charge-generation material for improving conductivity, in addition to the above-stated materials. The charge-generation material may be evenly or unevenly dispersed in the hole transport region. The charge-generation material may be, for example, a p-dopant. The p-dopant may include at least one selected from a quinone derivative, a metal oxide, and a cyano group-containing compound, but the present invention is not limited thereto. For example, the p-dopant may include a quinone derivative (such as tetracyanoquinodimethane (TCNQ), F4-TCNQ (2,3,5,6-tetrafluoro-7,7,8,8-tetracyano-quinodimethane), and the like), a metal oxide (such as a tungsten oxide, a molybdenum oxide, and the like), HAT-CN (1,4,5,8,9,11-hexaazatriphenylene-hexacarbonitrile), a compound represented by Chemical Formula 221, and/or at least one selected from Chemical Formula P1 to Chemical Formula P18, but the present invention is not limited thereto.

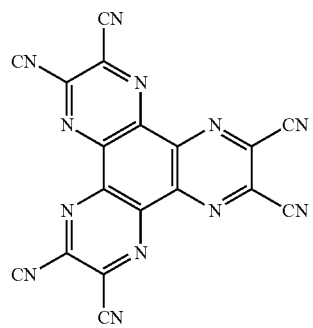

<HAT-CN>

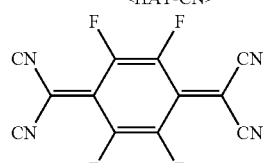

<F4-TCNQ>

Chemical Formula 221

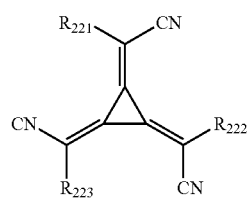

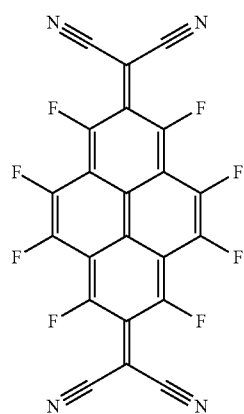

P1

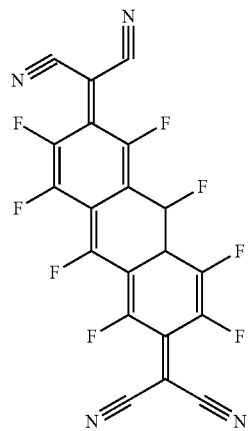

P2

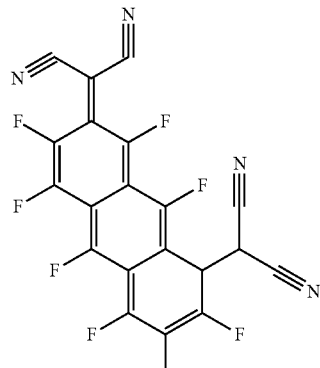

P3

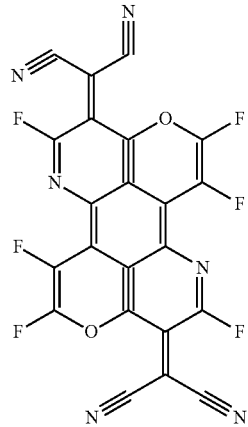

P4

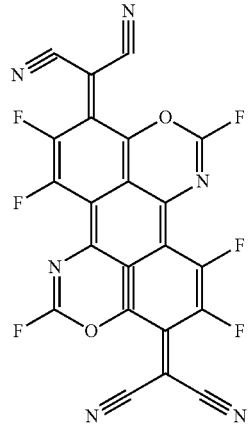

P5

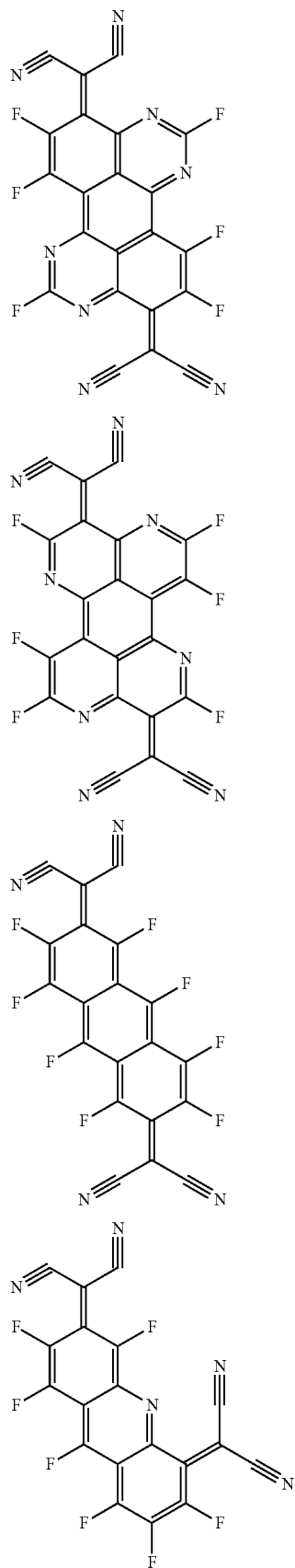
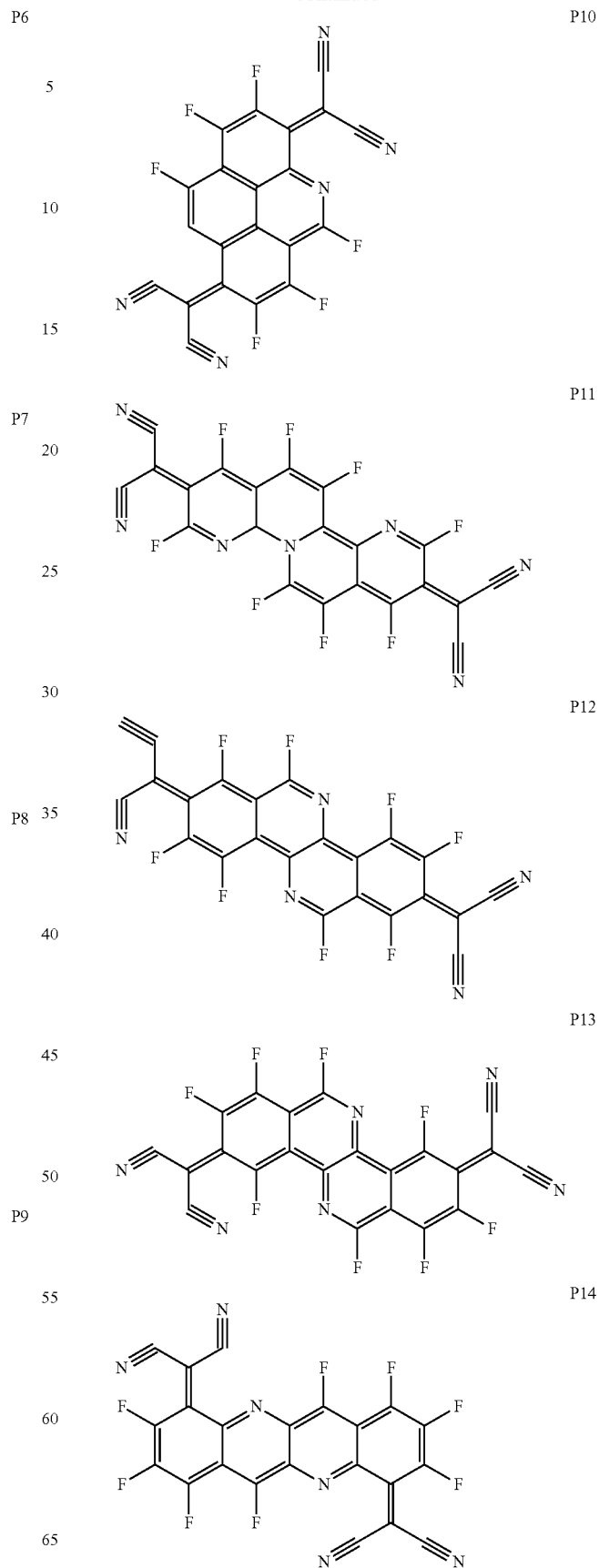

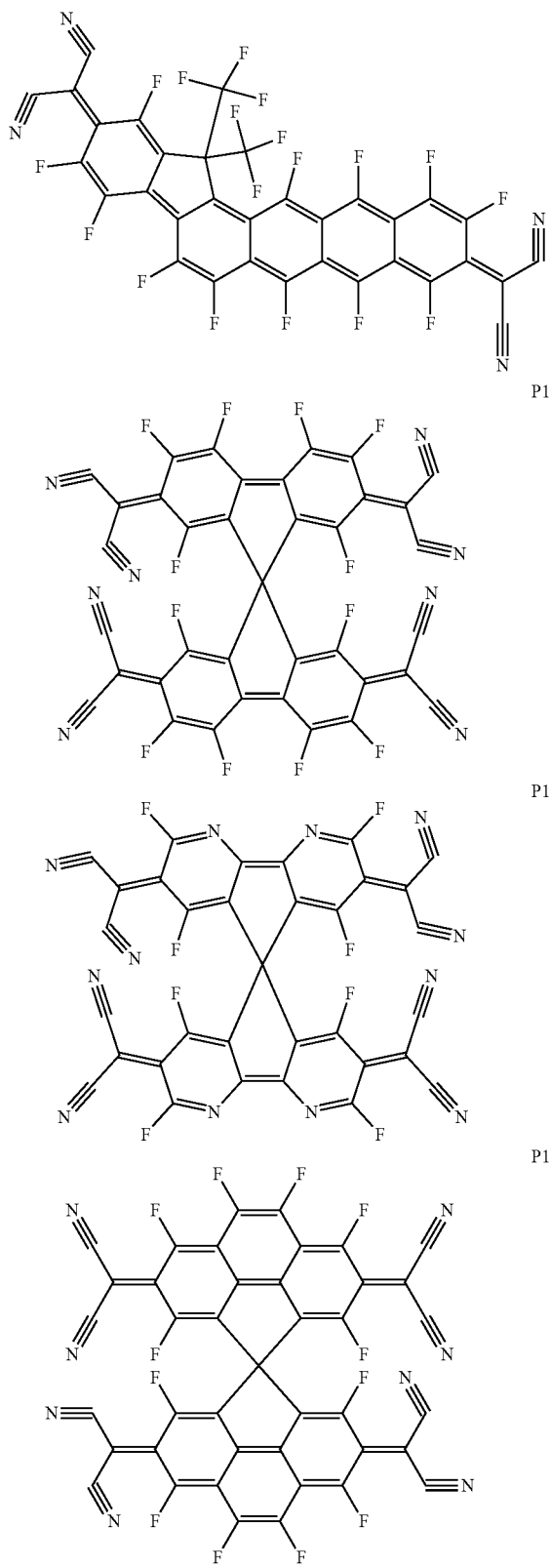

P15

P16

P17

P18

In Chemical Formula 221, $R_{221}$ to $R_{223}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group. At least one of $R_{221}$ to $R_{223}$ has at least one selected from a cyano group; a $C_1$-$C_{20}$ alkyl group substituted with —F, —Cl, —Br, or —I; a $C_1$-$C_{20}$ alkyl group substituted with —Cl; a $C_1$-$C_{20}$ alkyl group substituted with —Br; and a $C_1$-$C_{20}$ alkyl group substituted with —I.

With the above-stated hole transport region, an injection amount of holes into the emission layer can be adjusted. Thus, an appropriate level of holes are provided to the emission layer by preventing or substantially preventing an excessive amount of holes from being injected into the emission layer so that collision between holes and electrons can be increased, thereby increasing the formation of excitons from recombination of the holes and electrons. Accordingly, light emission efficiency of the organic light emitting diode according to the exemplary embodiment of the present invention can be increased.

When the organic light emitting device is provided as a full-color organic light emitting device, the emission layer may be patterned into a red emission layer, a green emission layer, and a blue emission layer per sub-pixel. Alternatively, the emission layer may have a structure in which two or more layers selected from the red emission layer, the green emission layer, and the blue emission layer are stacked while contacting each other or stacked apart from each other, or may have a structure in which two or more materials selected from a red light emission material, a green light emission material, and a blue light emission layer are mixed in the same layer such that white light can be emitted.

According to the exemplary embodiment of the present invention, in the emission layer, holes and electrons can be more actively recombined in a region that is adjacent to (e.g., closer to) the hole transport region than in a region adjacent to (e.g., closer to) an electron transport region. The excitons may be formed in all regions of the emission layer, but a region with the largest light emission may be disposed adjacent to the hole transport region.

In the above-described hole transport region, because the amount of holes injected into the emission layer can be adjusted, a plurality of holes can be provided at a location adjacent to the hole transport region in the emission layer. Accordingly, excitons formed from recombination of the electrons and holes may be dispersed adjacent to the hole transport region.

The emission layer may include a host and a dopant. The dopant may include at least one of a phosphorescent dopant and a fluorescent dopant. An amount of the dopant in the emission layer may be included within a range of about 0.01 wt % to about 15 wt % with respect to (i.e., based on) about 100 wt % of the host in general, but the present invention is not limited thereto.

The emission layer may have a thickness of about 100 Å to about 1000 Å, for example, from about 200 Å to about 600 Å. When the thickness of the emission layer satisfies the above-stated range, excellent light emission characteristics can be achieved without substantially increasing a driving voltage.

The host may include a compound represented by Chemical Formula 301.

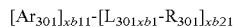 Chemical Formula 301

In Chemical Formula 301, $Ar_{301}$ may be a substituted or unsubstituted $C_5$-$C_{60}$ carbocyclic group or a substituted or unsubstituted $C_1$-$C_{60}$ heterocyclic group. Xb11 may be 1, 2, or 3. $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenyl group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group. xb1 is selected from integers of 0 to 5. $R_{301}$ is selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$). xb21 is selected from integers of 1 to 5, and $Q_{301}$ to $Q_{303}$ may be each independently selected from a $C_1$-$C_{10}$ alkyl group, a $C_1$-$C_{10}$ alkoxy group, a phenyl group, a biphenyl group, a terphenyl group, and a naphthyl group, but the present invention is not limited thereto.

As another example, the host may include an alkali earth metal complex. For example, the host may be selected from a Be complex (e.g., compound H55), a Mg complex, and a Zn complex.

The host may include at least one selected from ADN (9,10-di(2-naphthyl)anthracene), MADN (2-methyl-9,10-bis(naphthalen-2-yl)anthracene), TBADN (9,10-di-(2-naphthyl)-2-t-butyl-anthracene), CBP (4,4'-bis(N-carbazolyl)-1,1'-biphenyl), mCP (1,3-di-9-carbazolylbenzene), TCP (1,3,5-tri(carbazol-9-yl)benzene), and compounds H1 to H55, but the present invention is not limited thereto.

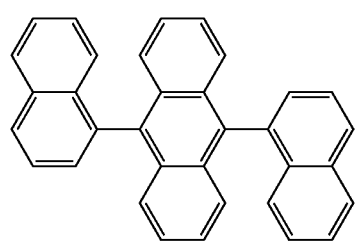

H1

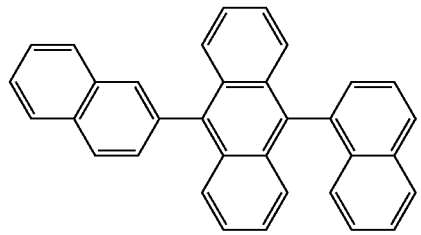

H2

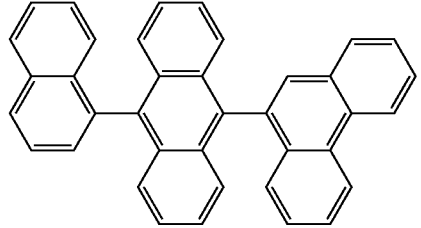

H3

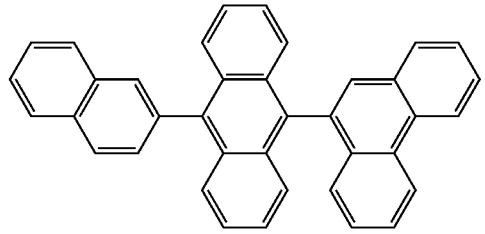

H4

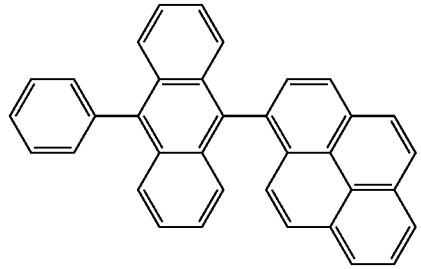

H5

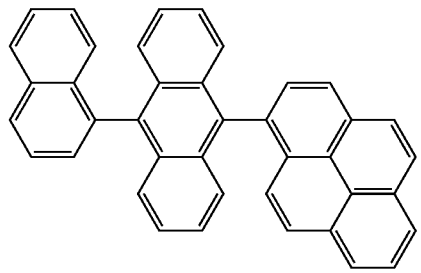

H6

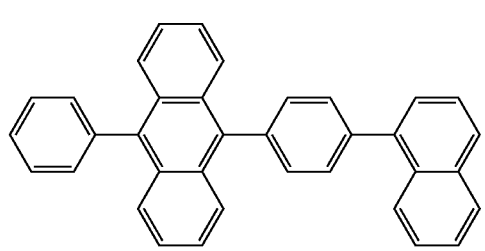

H7

-continued
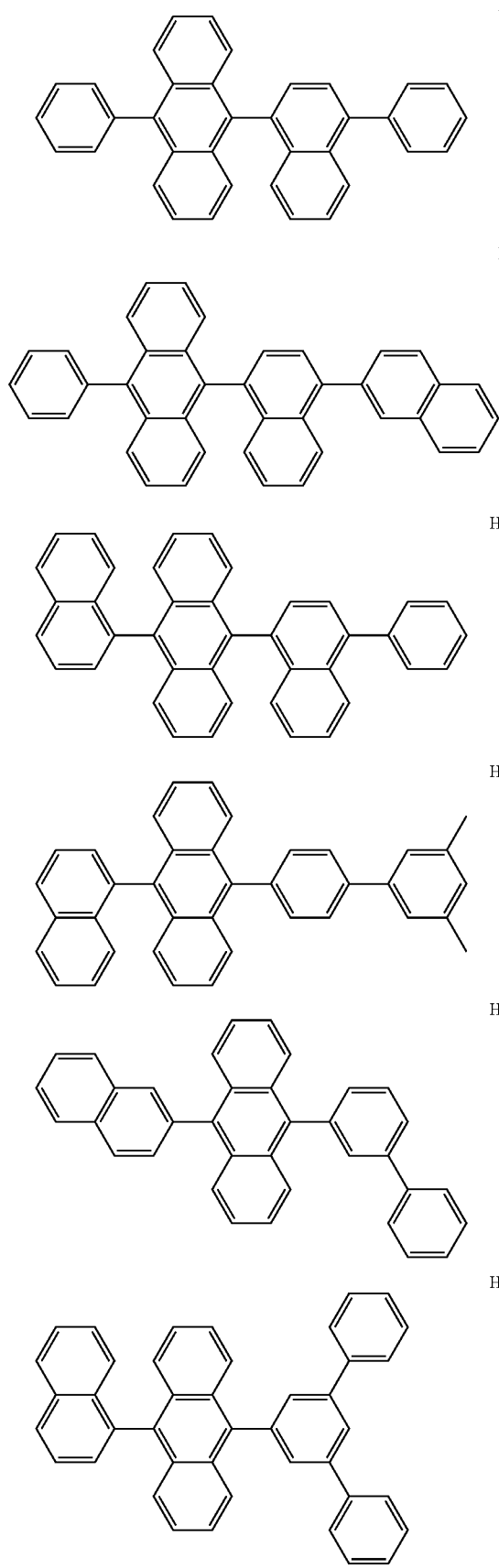
H8
H9
H10
H11
H12
H13
-continued
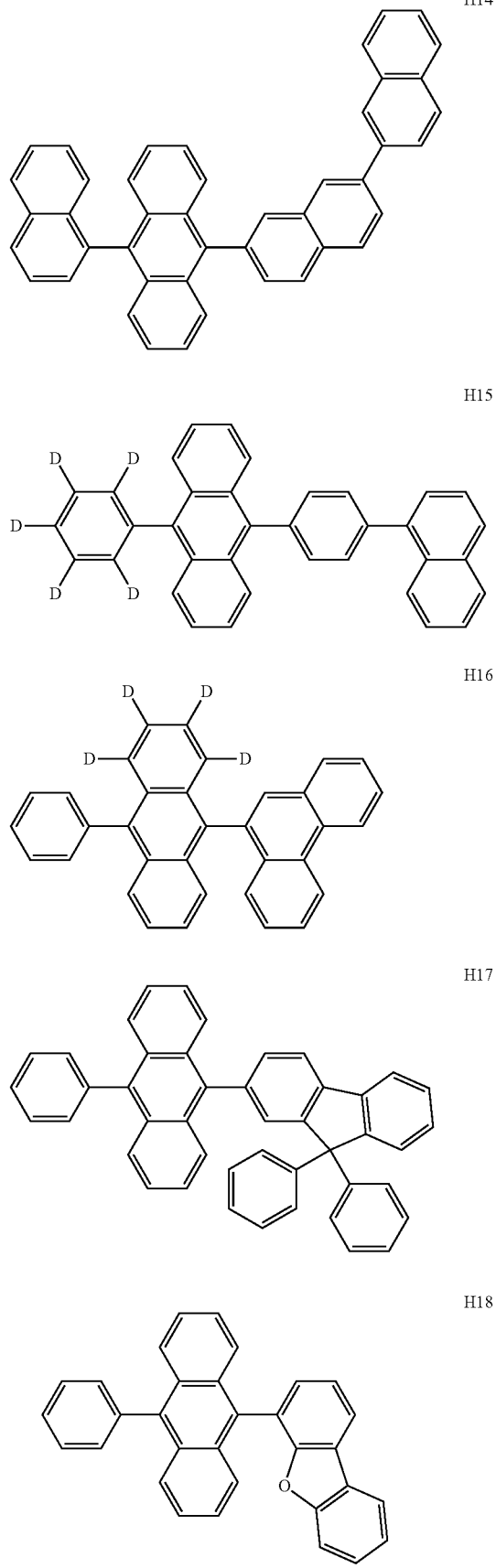
H14
H15
H16
H17
H18

-continued
H19
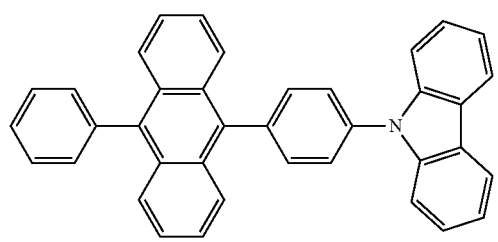
H20
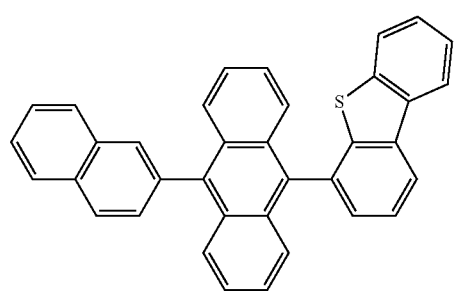
H21
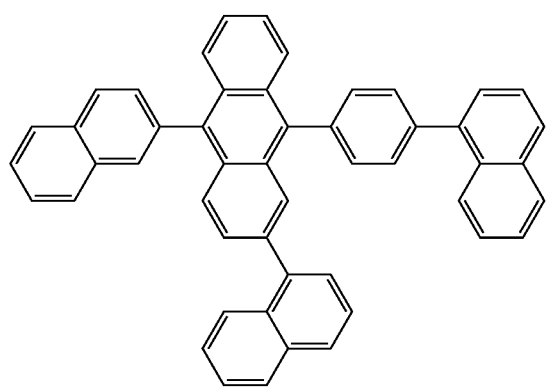
H22
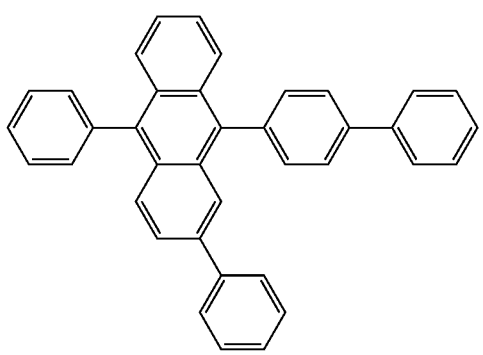
-continued
H23
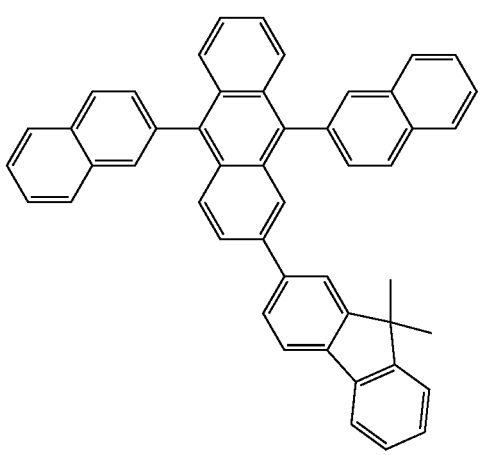
H24
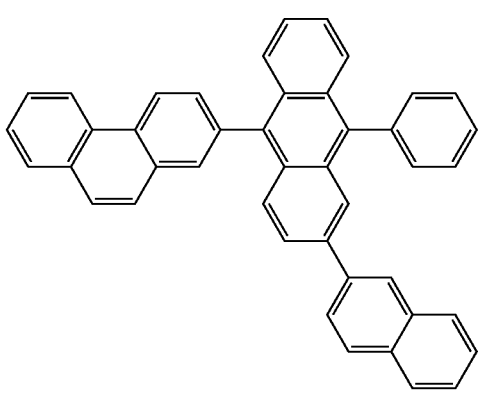
H25
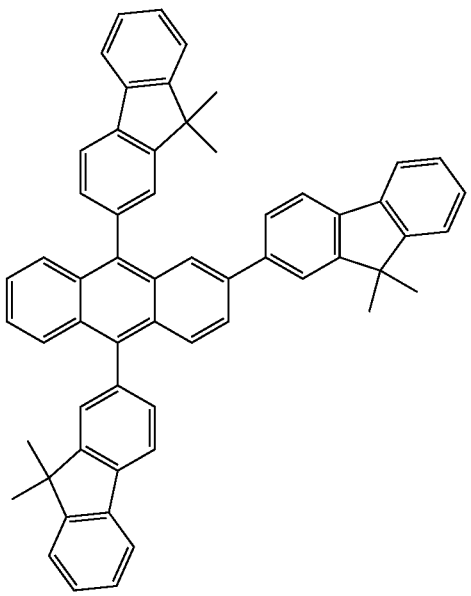

H26
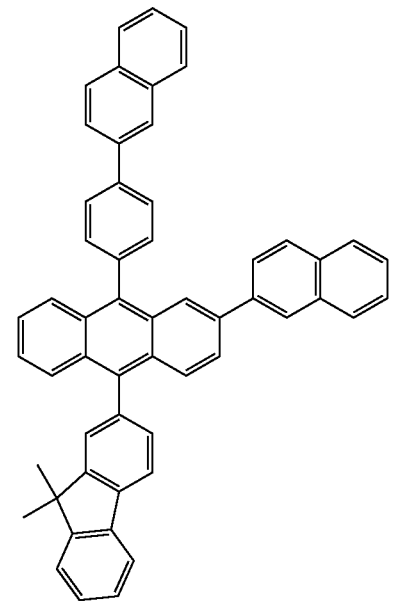
H27
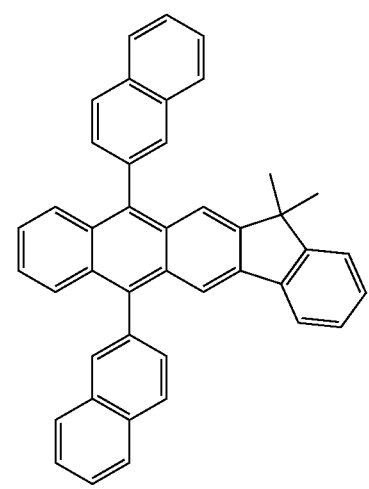
H28
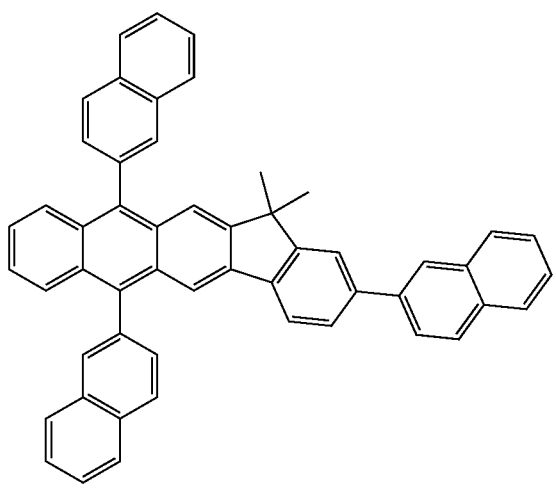
H29
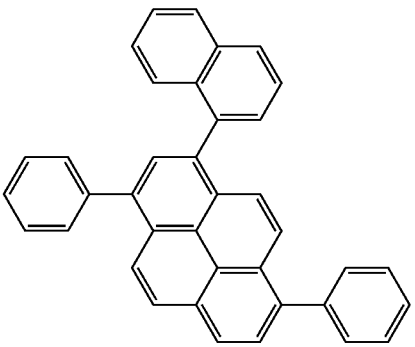
H30
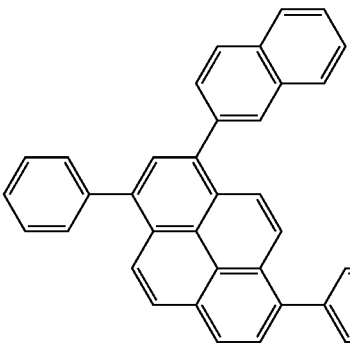
H31
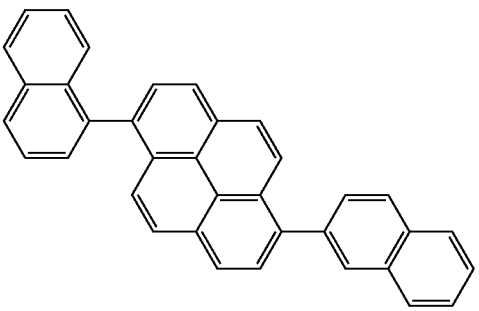
H32
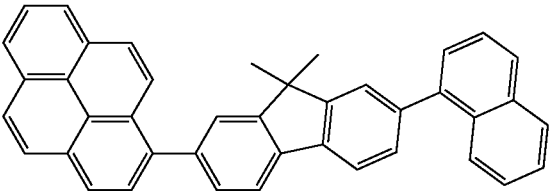
H33

H34
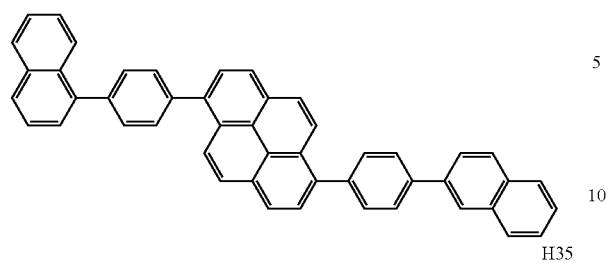
H35
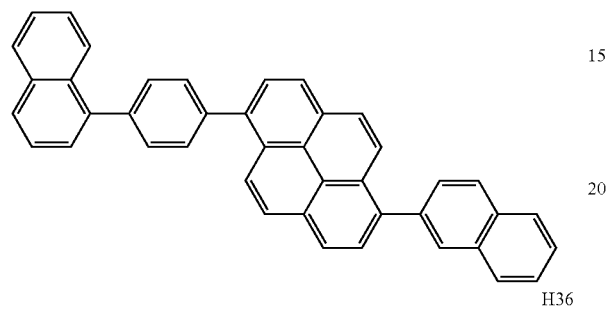
H36
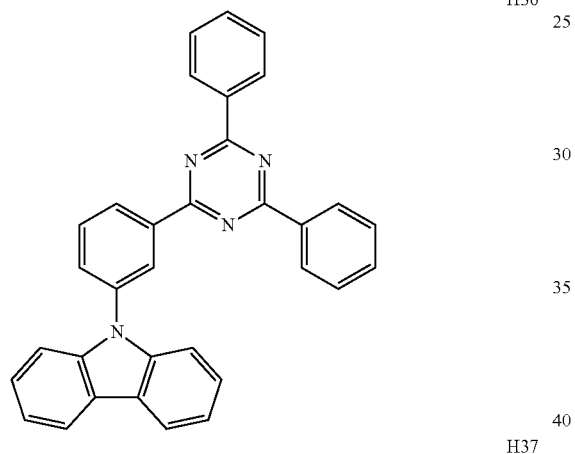
H37
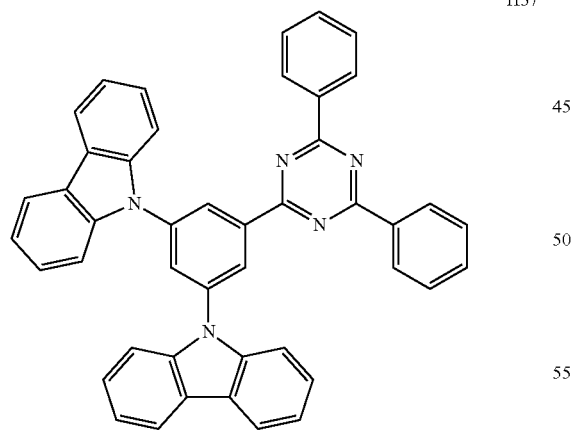
H38
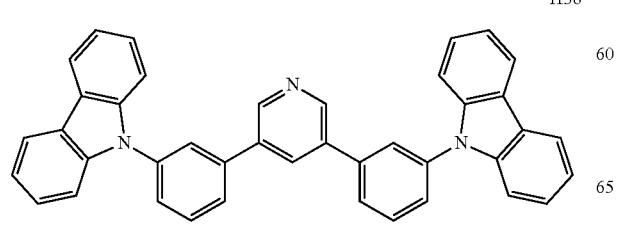
H39
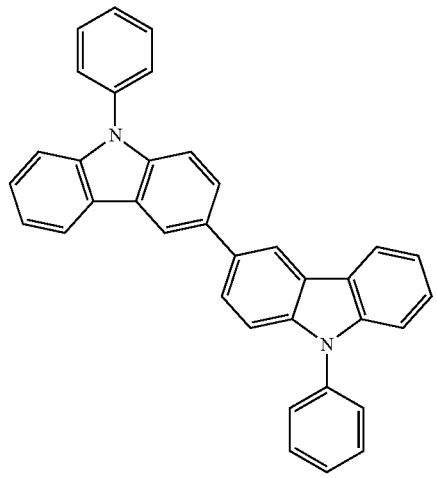
H40
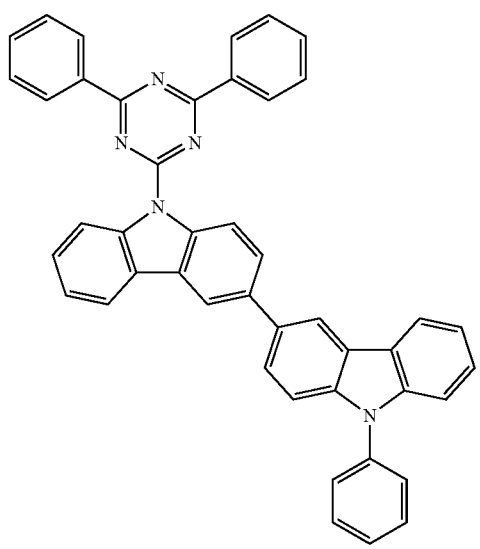
H41
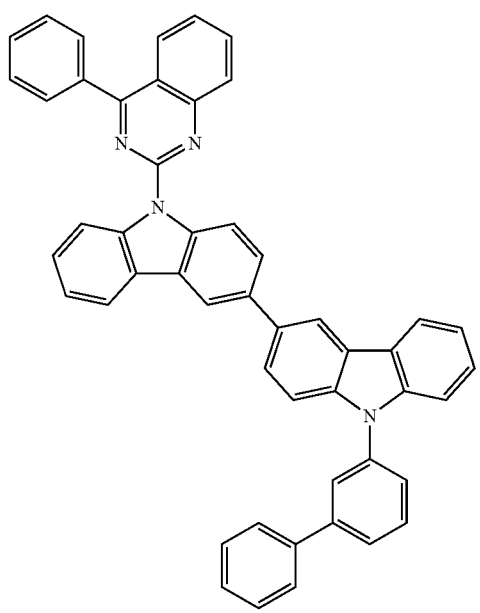

-continued
H42 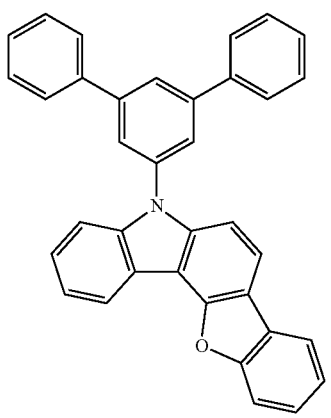
H43 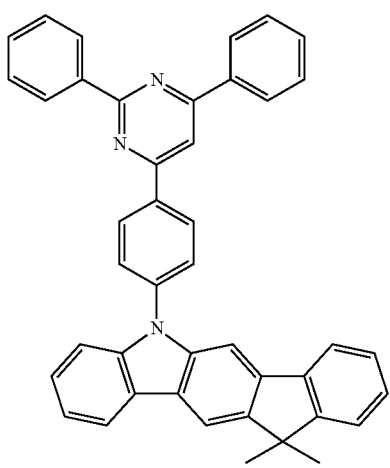
H44 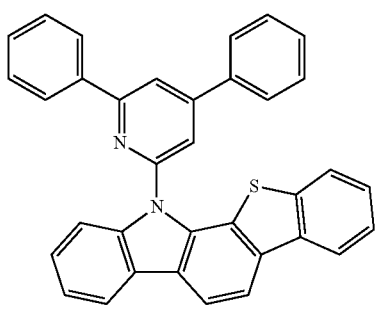
H45 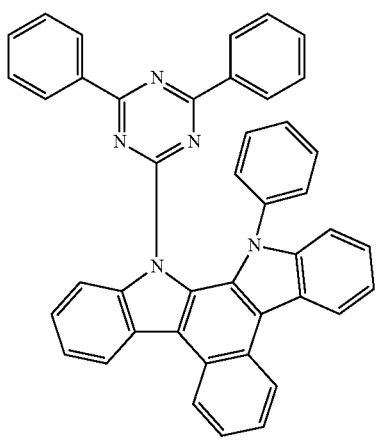
-continued
H46 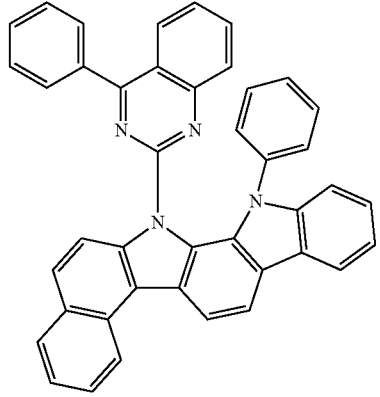
H47 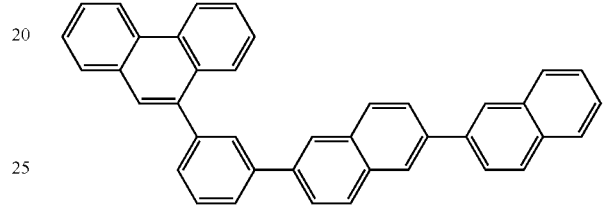
H48 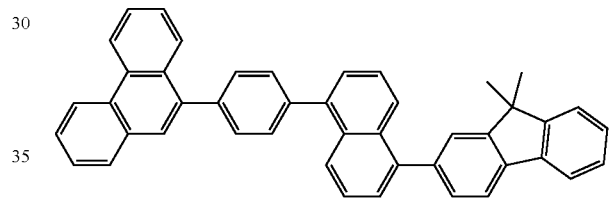
H49 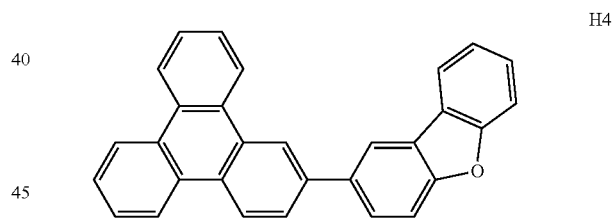
H50 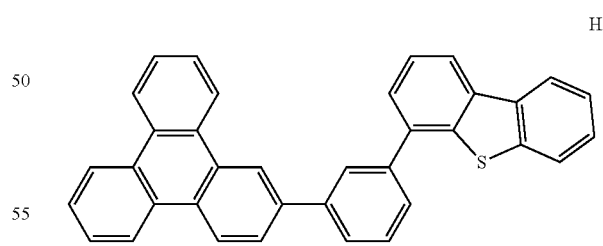
H51 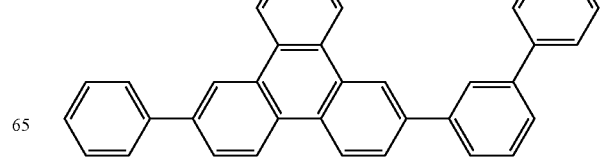

-continued

H52

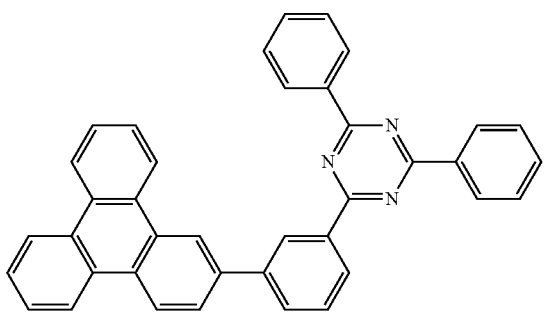

H53

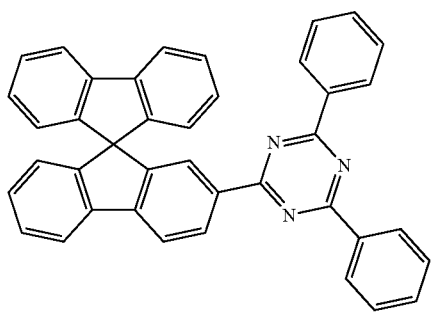

H54

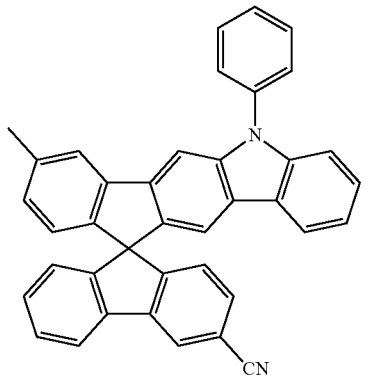

H55

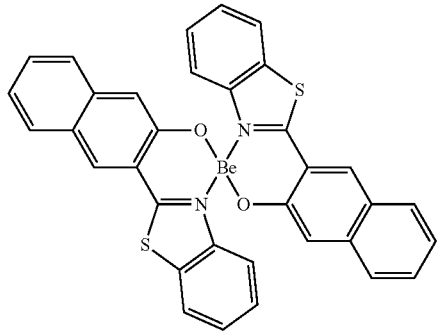

The phosphor dopant (e.g., the phosphorescent dopant) may include an organic metal complex represented by Chemical Formula 401.

Chemical Formula 401

$$M(L_{401})_{xc1}(L_{402})_{xc2}$$

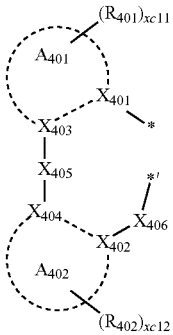

Chemical Formula 402

In Chemical Formula 401 and Chemical Formula 402, M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm). $L_{401}$ may be selected from a ligand represented by Chemical Formula 402. xc1 may be 1, 2, or 3. When xc1 is greater than or equal to 2, 2 or more of $L_{401}$(s) may be the same as or different from each other. $L_{402}$ may be an organic ligand. xc2 may be selected from integers of 0 to 4. When xc2 is greater than or equal to 2, 2 or more of $L_{402}$(s) may be the same as or different from each other. $X_{401}$ to $X_{404}$ may each independently be nitrogen or carbon. $X_{401}$ and $X_{403}$ may be connected with each other through a single bond or a double bond. $X_{402}$ and $X_{404}$ may be connected with each other through a single bond or a double bond. $A_{401}$ and $A_{402}$ may independently be a $C_5$-$C_{60}$ carbocyclic group or a $C_1$-$C_{60}$ heterocyclic group. $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)—*'. $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group. $X_{406}$ may be a single bond, O, or S. $R_{401}$ and $R_{402}$ may each independently be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), wherein $Q_{401}$ to $Q_{403}$ may be each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group. xc11 and xc12 may be each independently selected from integers of 0 to 10, and * and *' in Chemical Formula 402 each represent a binding site with M in Chemical Formula 401.

Alternatively, the phosphor dopant may be selected from compound PD1 to compound PD 25, but the present invention is not limited thereto.

PD1 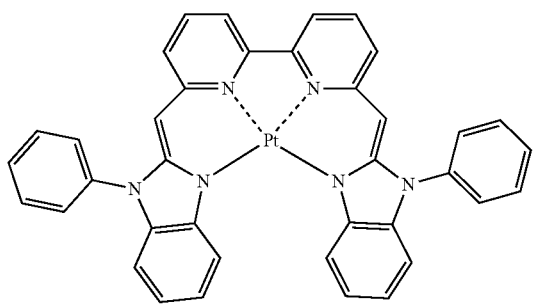
PD6 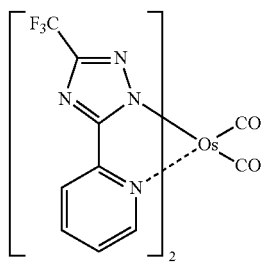
PD2 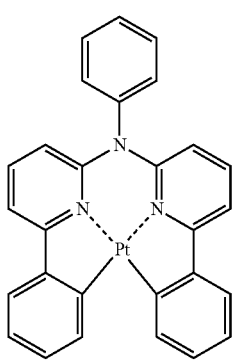
PD7 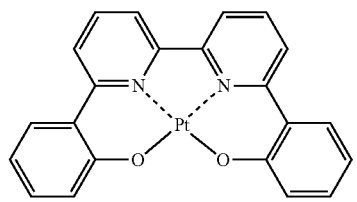
PD8 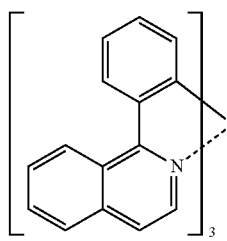
PD3 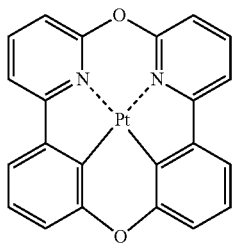
PD9 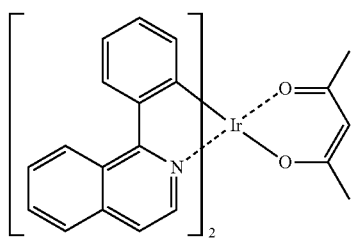
PD4 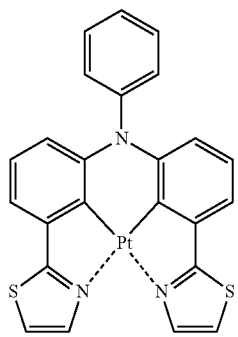
PD10 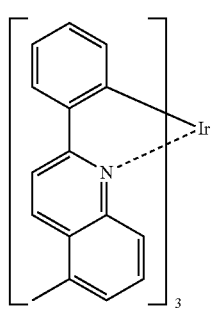
PD5 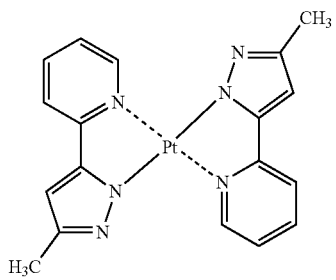
PD11 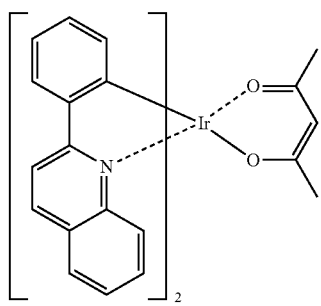

PD12 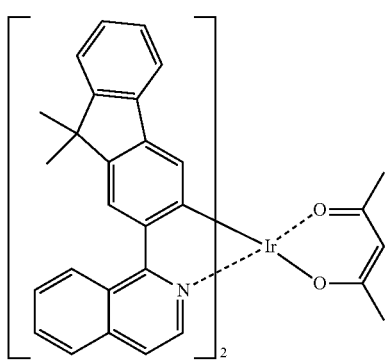
PD13 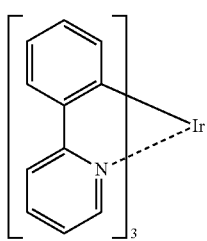
PD14 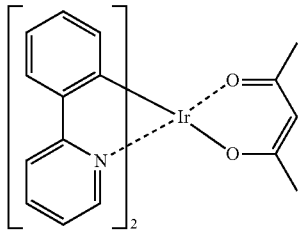
PD15 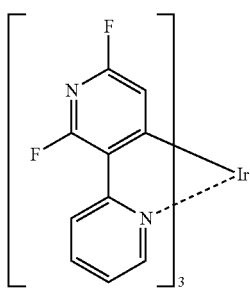
PD16 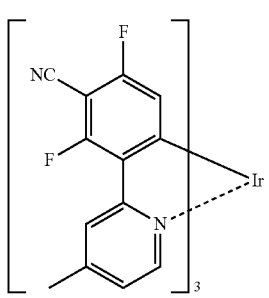
PD17 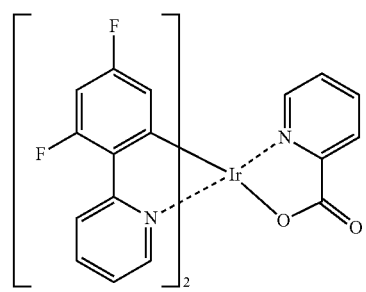
PD18 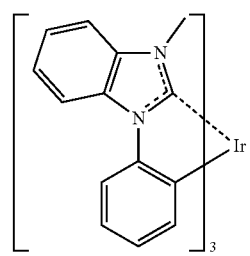
PD19 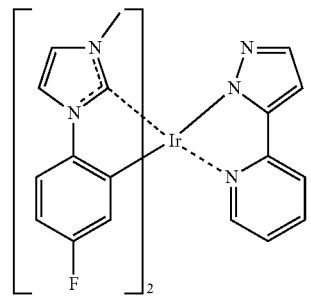
PD20 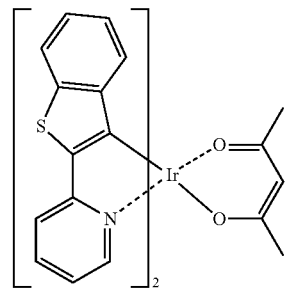
PD21 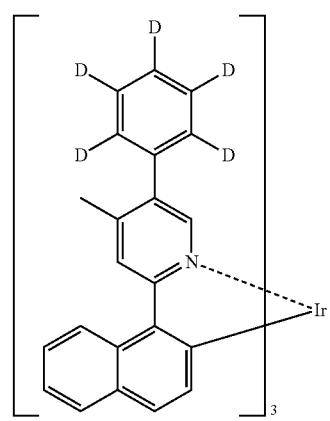

-continued

PD22

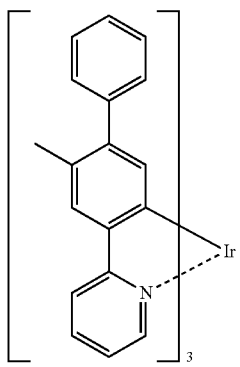

PD23

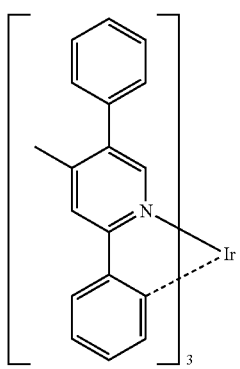

PD24

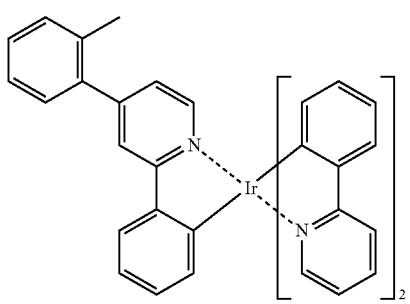

PD25

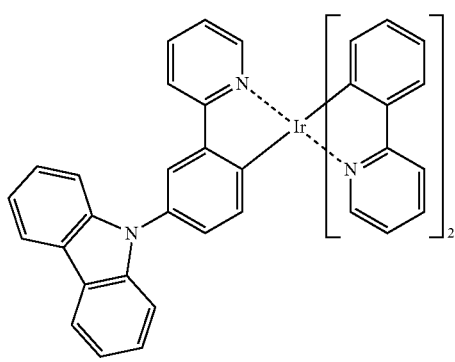

The fluorescent dopant may include a compound represented by Chemical Formula 501.

Chemical Formual 501

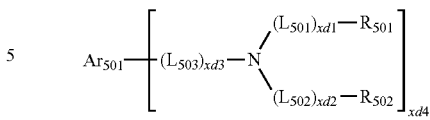

In Chemical Formula 501, $Ar_{501}$ may be a substituted or unsubstituted $C_5$-$C_{60}$ carbocyclic group or a substituted or unsubstituted $C_1$-$C_{60}$ heterocyclic group. $L_{501}$ to $L_{503}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group. xd1 to xd3 may be each independently selected from integers of 0 to 3. $R_{501}$ and $R_{502}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group. Xd4 may be selected from integers of 1 to 6.

For example, the fluorescent dopant may be selected from compound FD1 to compound FD22.

FD1

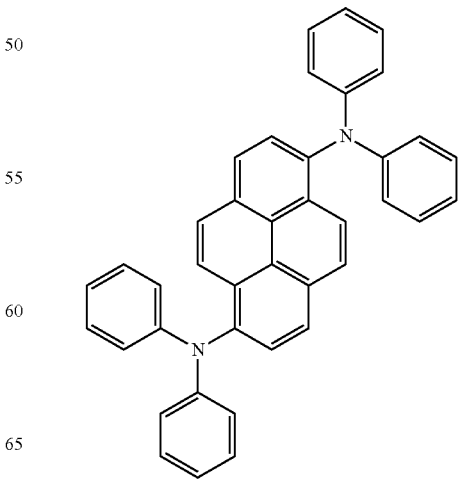

-continued
FD2
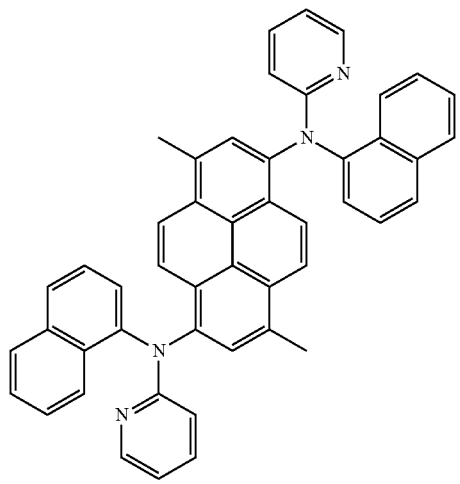
FD3
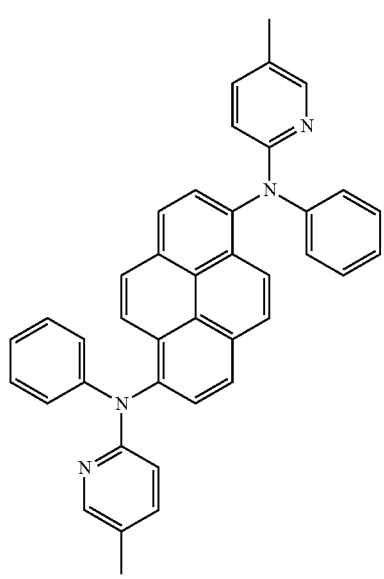
FD4
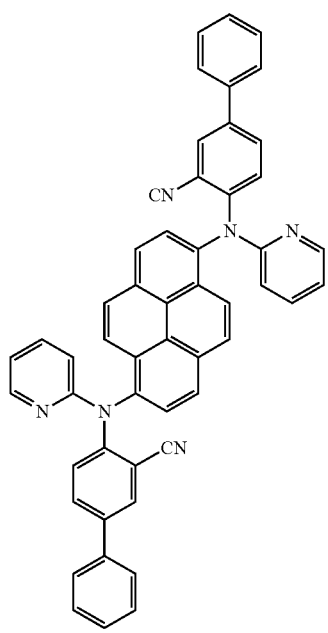
-continued
FD5
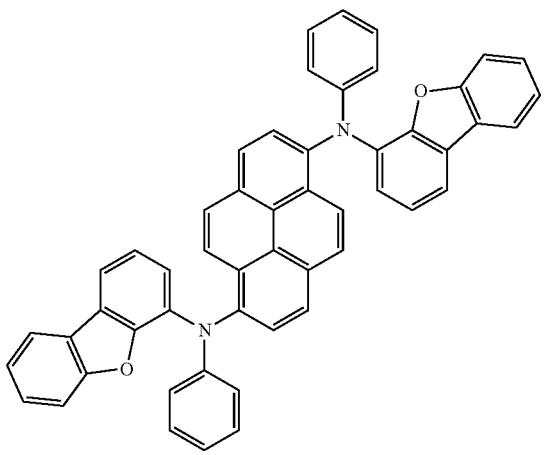
FD6
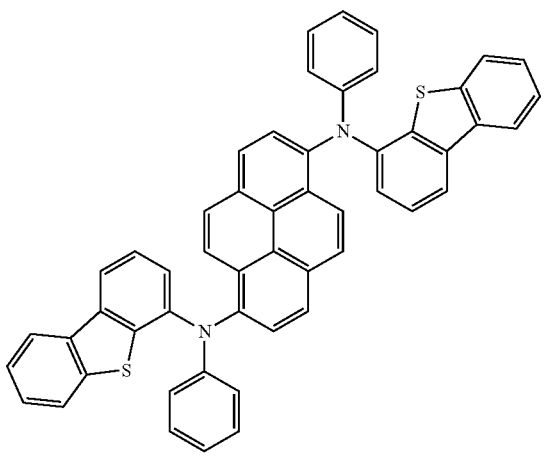
FD7
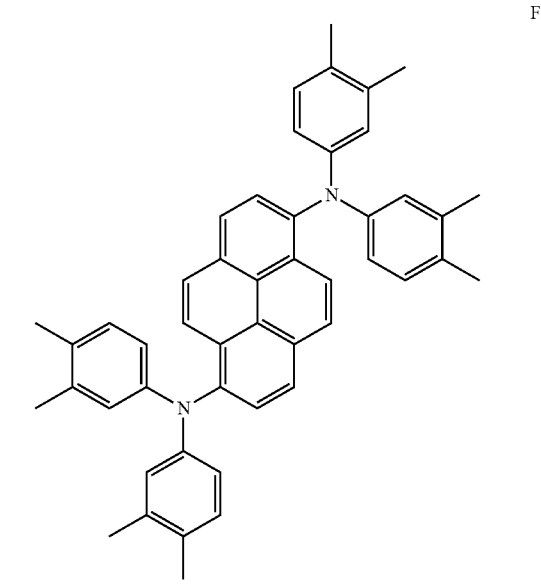

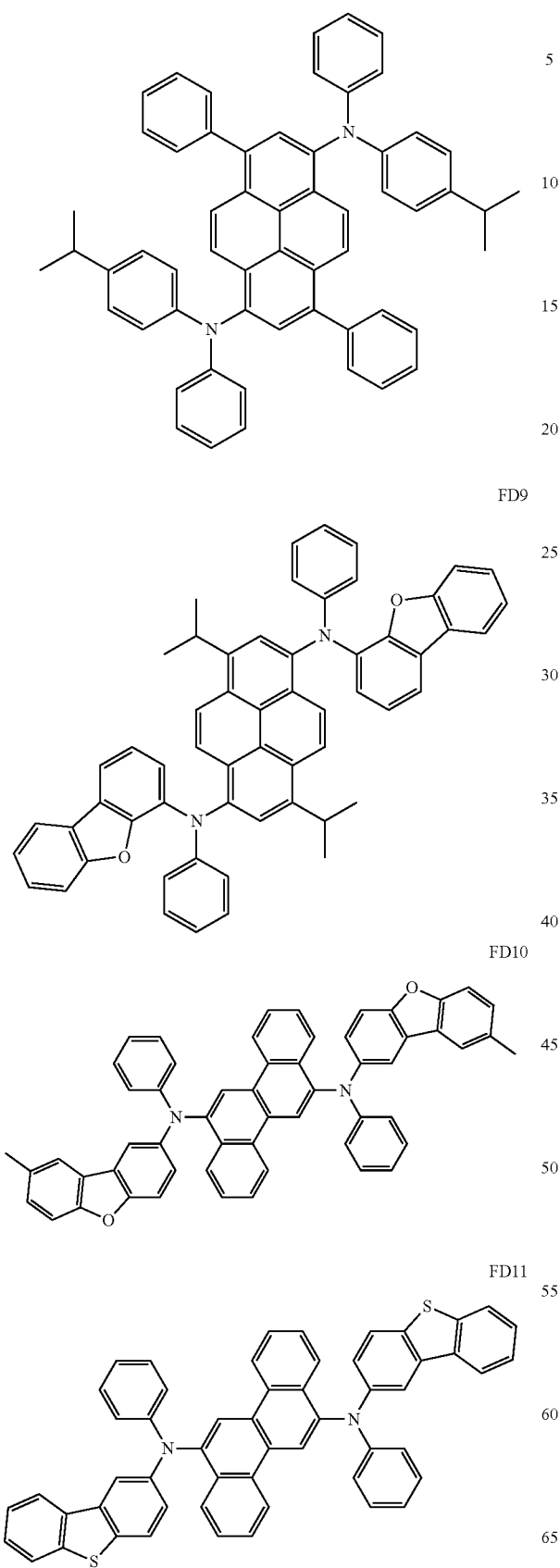
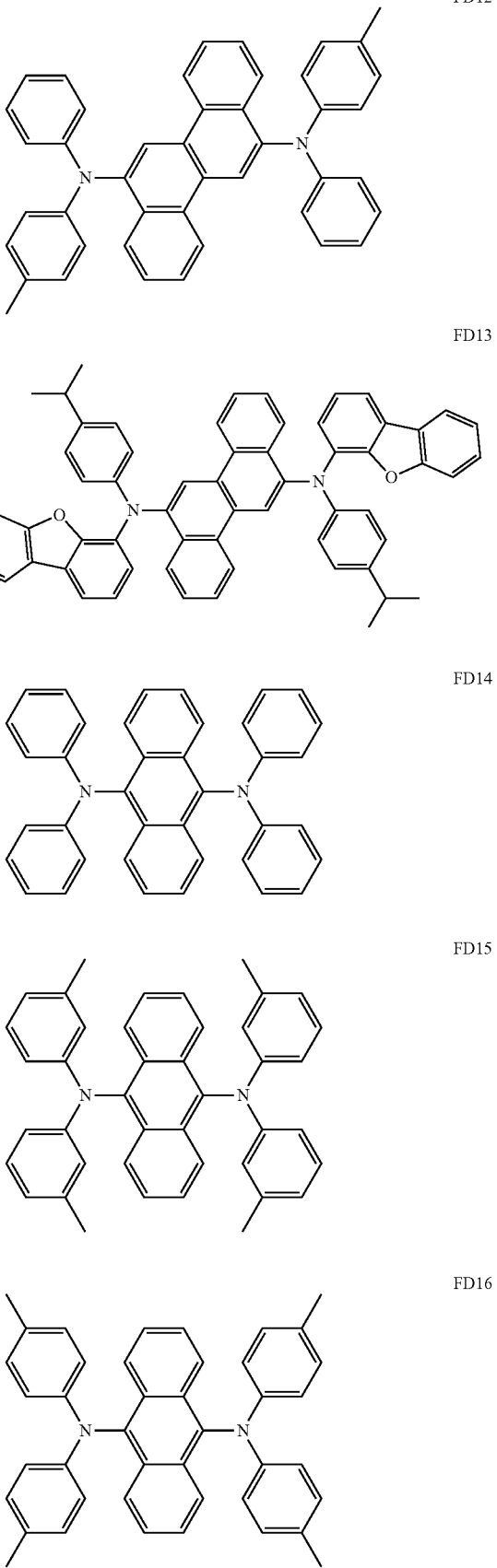

FD17
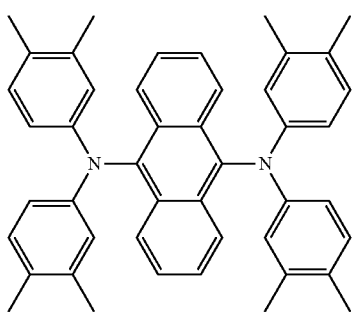
FD18
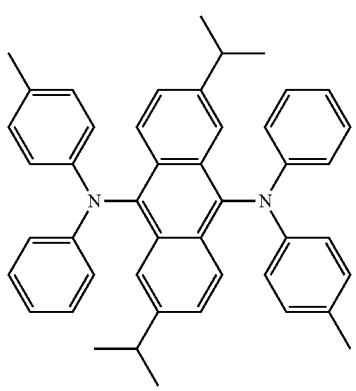
FD19
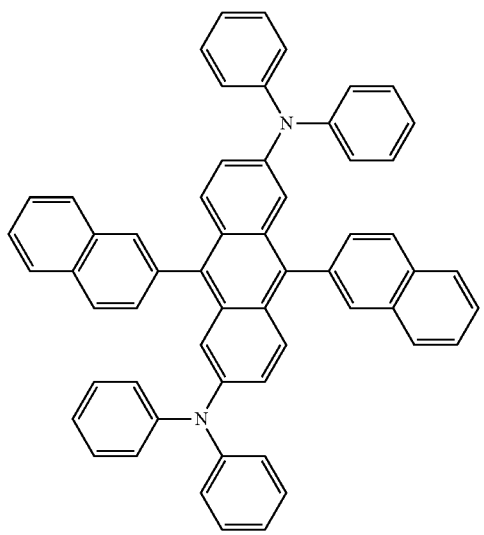
FD20
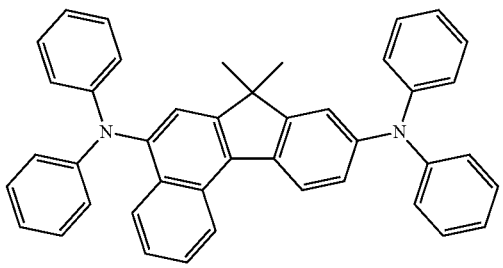
FD21
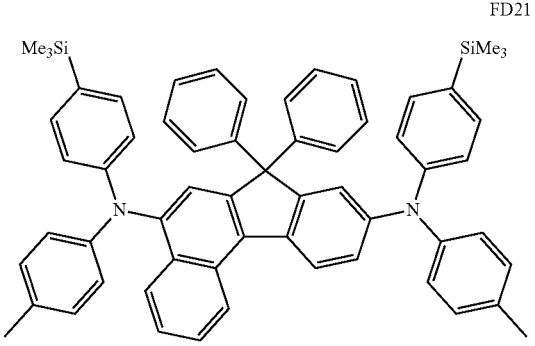
FD22
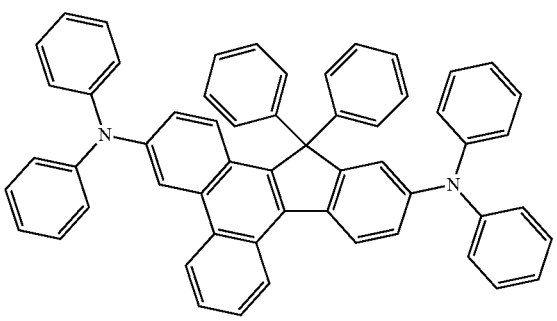
Alternatively, the fluorescent dopant may be selected from the following compounds, but the present invention is not limited thereto.
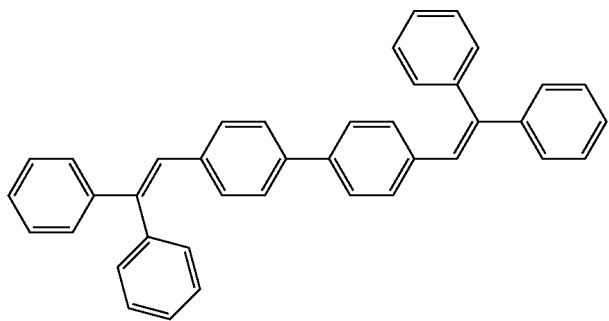
DPVBi

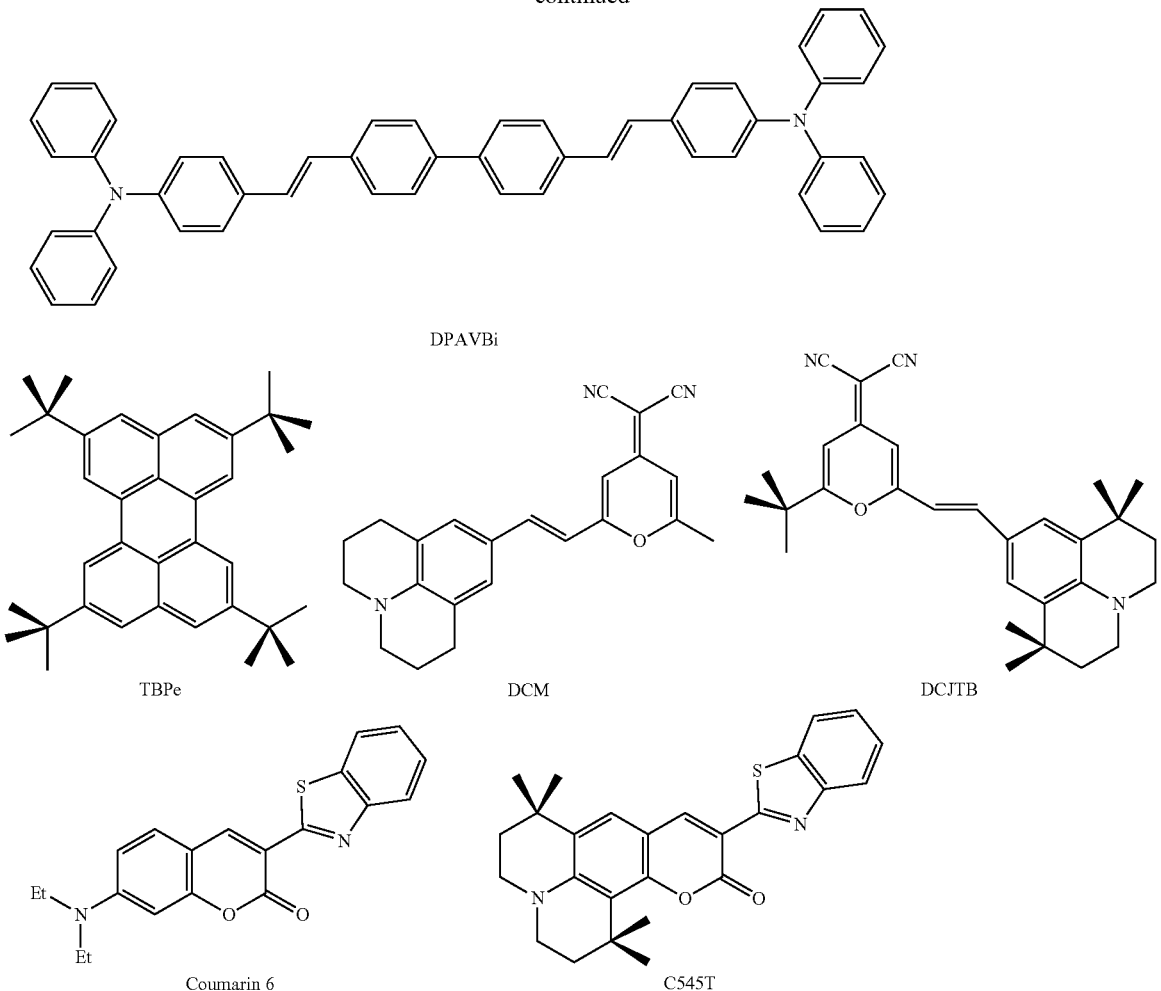

The electron transport region according to the exemplary embodiment may have i) a single-layered structure formed of a single layer made of a single material; ii) a single-layered structure formed of a single layer made of a plurality of different materials; or iii) a multi-layered structure formed of a plurality of layers formed of a plurality of different materials.

The electron transport region may include at least one selected from a buffer layer, a hole blocking layer, an electron adjusting layer, an electron transport layer (ETL), and an electron injection layer, but the present invention is not limited thereto.

For example, the electron transport region may have a structure of electron transport layer/electron injection layer, hole blocking layer/electron transport layer/electron injection layer, electron adjusting layer/electron transport layer/electron injection layer, or buffer layer/electron transport layer/electron injection layer, stacked sequentially from the emission layer, but the present invention is not limited thereto.

The electron transport region (e.g., the buffer layer, the hole blocking layer, the electron adjusting layer, and/or the electron transport layer in the electron transport region) may include a metal-free compound including at least one π electron deficient nitrogen ring.

The term "π electron deficient nitrogen ring" refers to that as a ring-forming moiety, a $C_1$-$C_{60}$ heterocyclic group having at least one *—N=*' moiety. For example, the term "π electron deficient nitrogen ring" may be i) a 5 to 7-membered heteromonocyclic group having at least one *—N=*' moiety; ii) a heteromonocyclic group having two or more of 5 to 7-membered heteromonocyclic groups having at least one *—N=*' moiety condensed with each other; or iii) a heteropolycyclic group having at least one of 5 to 7-membered heteromonocyclic groups having at least one *—N=*' moiety and at least one $C_5$-$C_{60}$ carbocylic group condensed with each other.

For example, the π electron deficient nitrogen ring may be imidazole, pyrazon, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoline, quinoxaline, quinazoline, cinnoline, phenanthridine, acridine, phenanthroline, phenazine, benzoimidazole, isobenzothiazole, benzoxazole, isobenzoxazole, triazole, tetrazole, oxadiazole, triazine, thiadiazole, imidazopyridine, imidazopyrimidine, azacavazole, and the like, but the present invention is not limited thereto.

The electron transport region may include a compound represented by Chemical Formula 601.

$$[Ar_{601}]_{xe11}\text{-}[L_{601xe1}\text{-}R_{601}]_{xe21}$$ Chemical Formula 601

In Chemical Formula 601, $Ar_{601}$ may be a substituted or unsubstituted $C_5$-$C_{60}$ carbocyclic group or a substituted or unsubstituted $C_1$-$C_{60}$ heterocyclic group. xe11 may be 1, 2, or 3. $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenyl group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group. xe1 may be selected from integers of 0 to 5. $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, —$(SiQ_{601})(Q_{602})(Q_{603})$, —$C(=O)(Q_{601})$, —$S(=O)_2(Q_{601})$, and —$P(=O)(Q_{601})(Q_{602})$, wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group. xe21 may be selected from integers of 1 to 5. According to an exemplary embodiment, at least one of the xe11 $Ar_{601}$ and xe21 $R_{601}$ may include the above-stated π electron deficient nitrogen ring.

The electron transport region may include at least one selected from compound ET1 to compound ET36, but the present invention is not limited thereto.

ET1

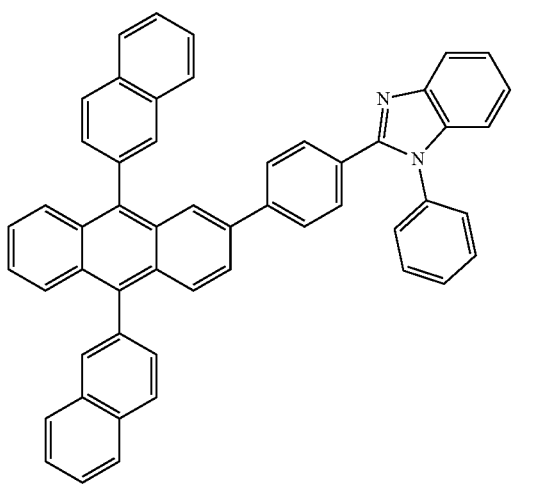

ET2

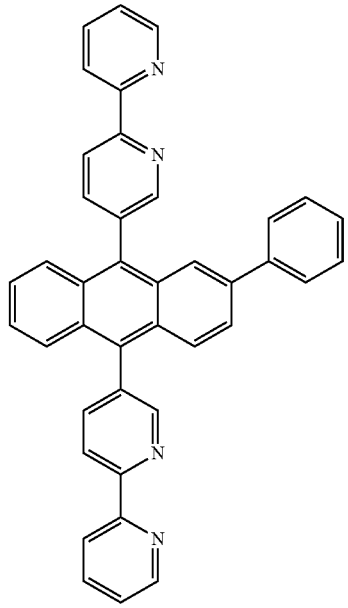

ET3

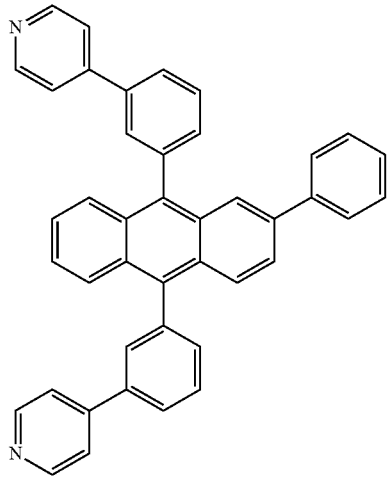

ET4

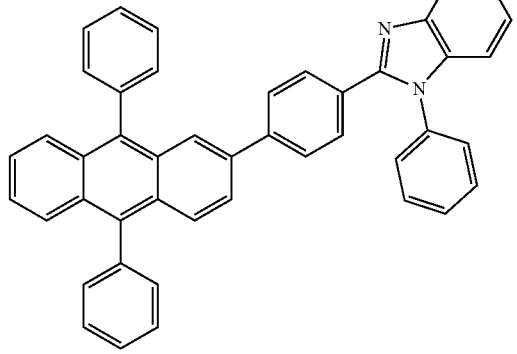

ET5
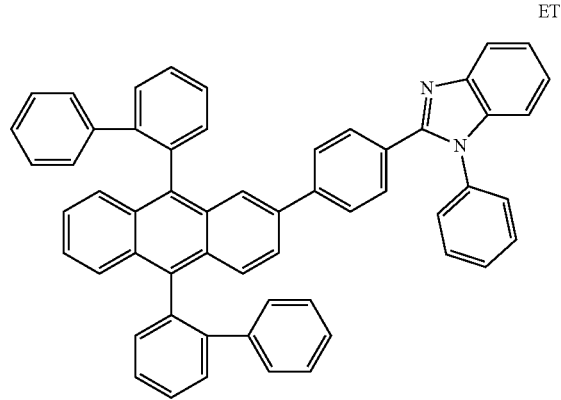
ET8
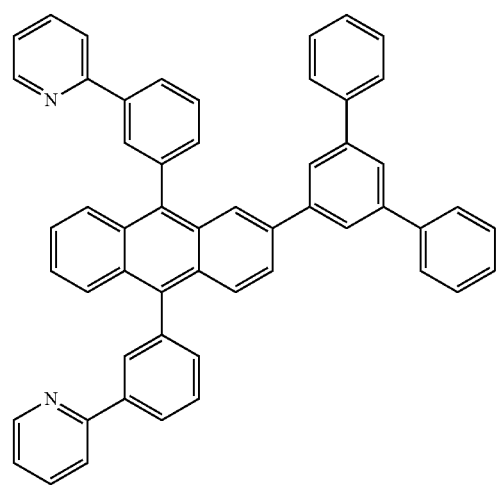
ET6
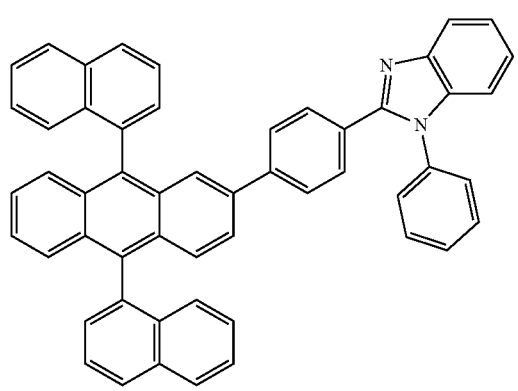
ET7
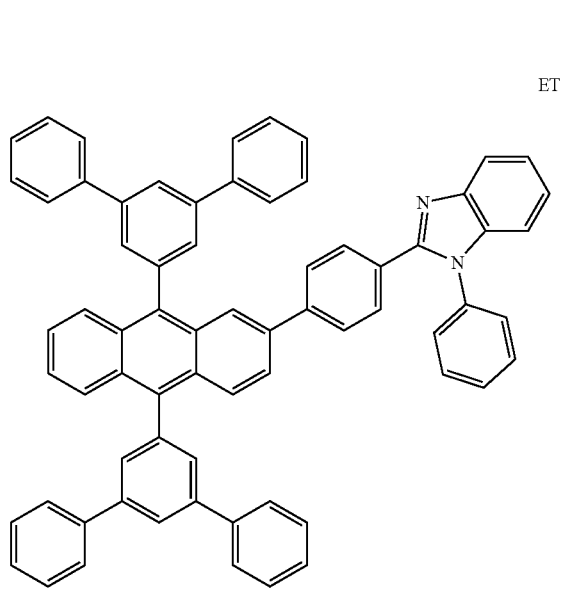
ET9
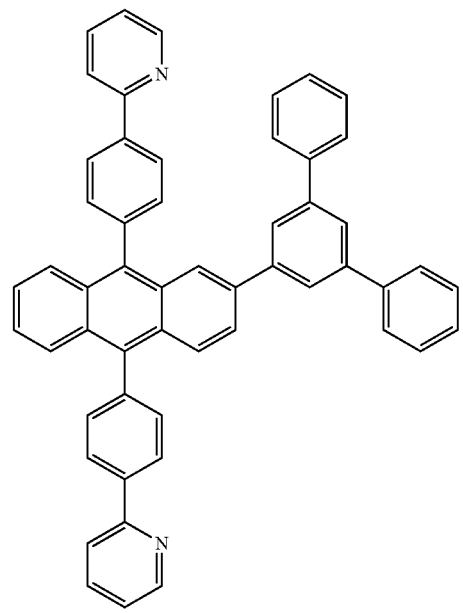

ET10
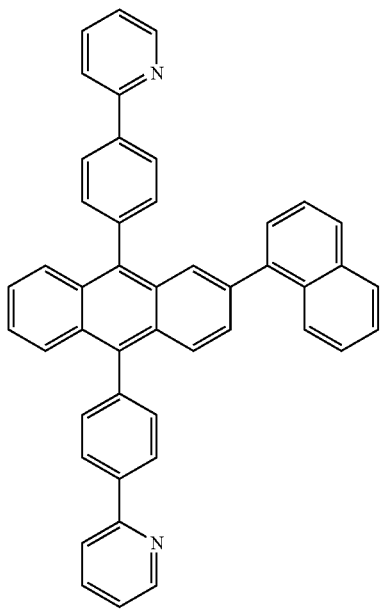
ET13
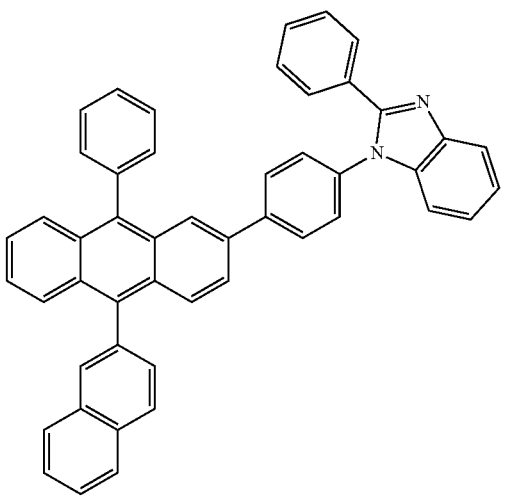
ET11
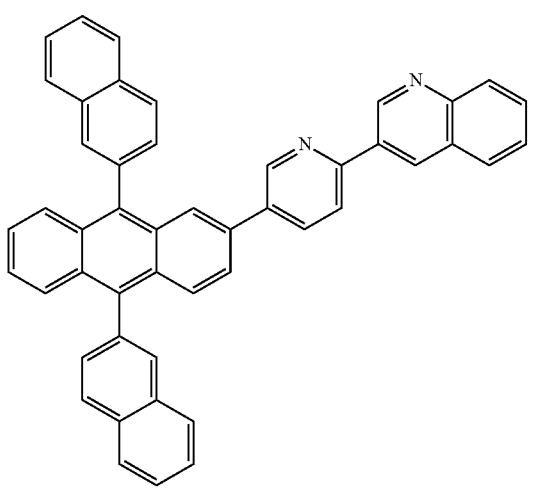
ET14
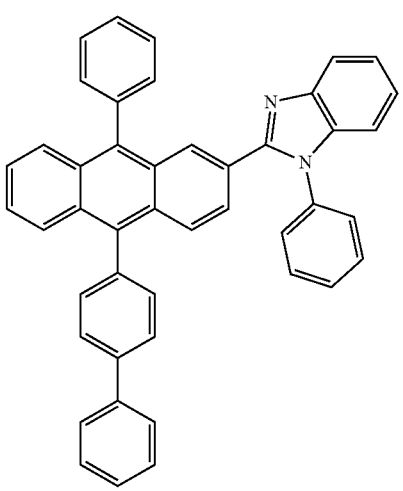
ET12
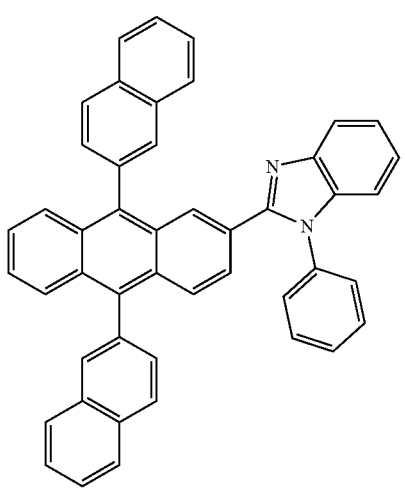
ET15
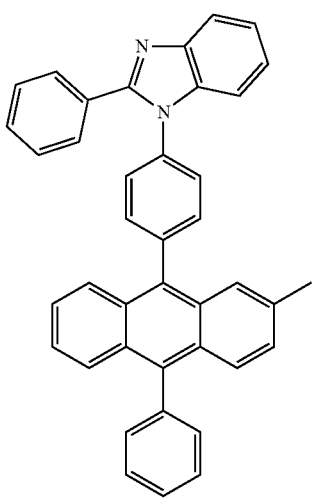

ET16
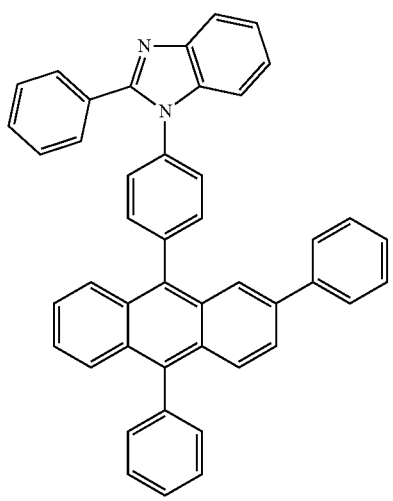
ET17
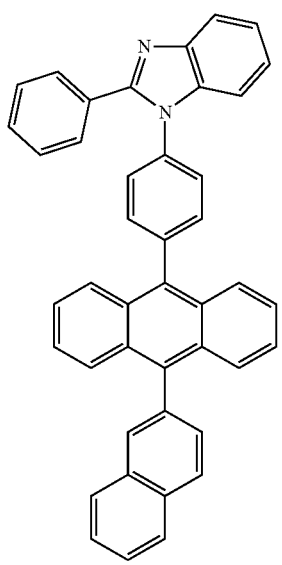
ET18
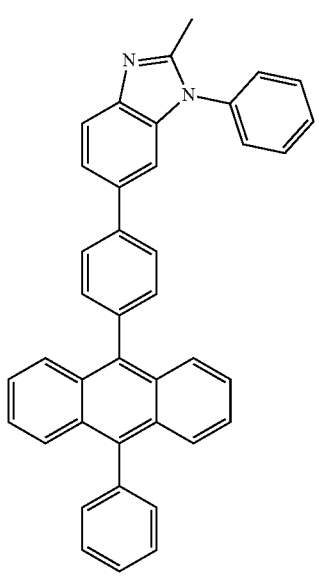
ET19
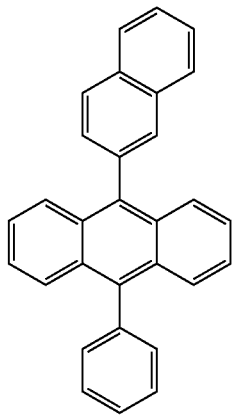
ET20
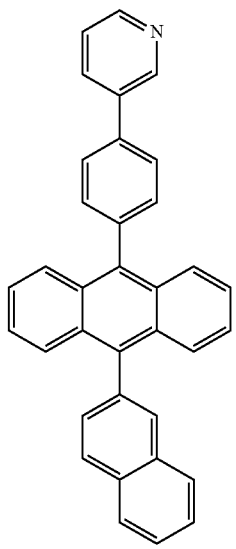
ET21
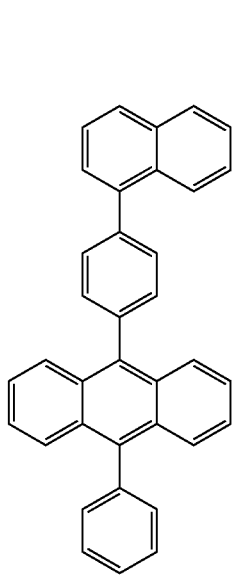

ET22
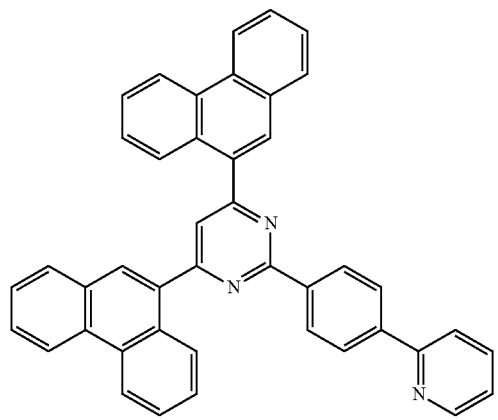
ET25
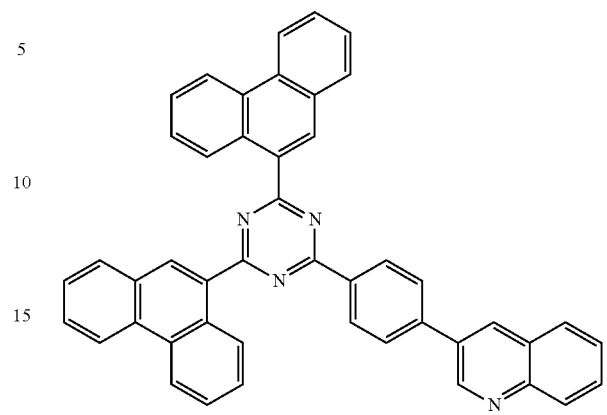
ET23
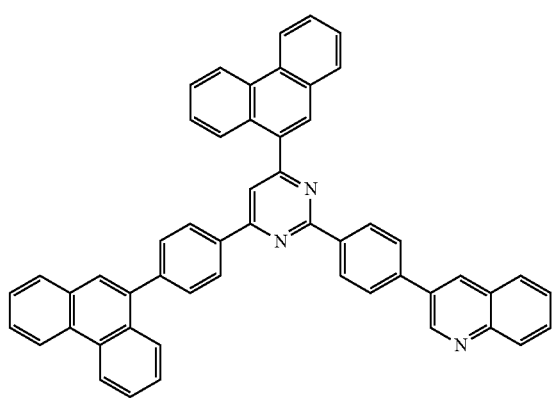
ET26
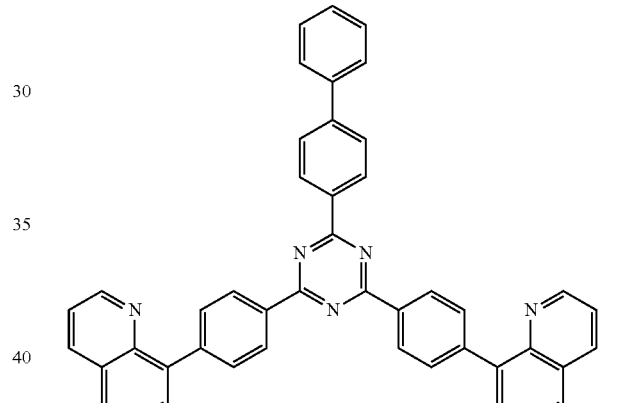
ET24
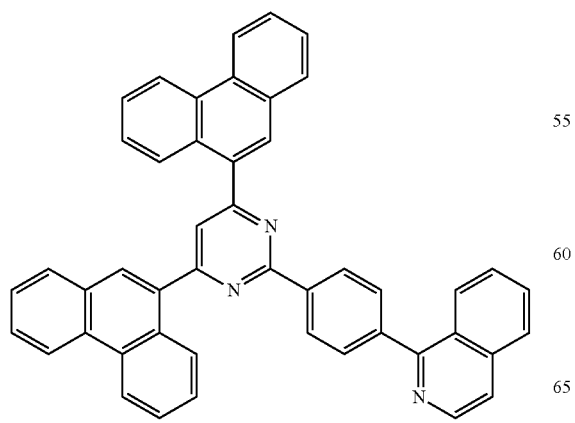
ET27
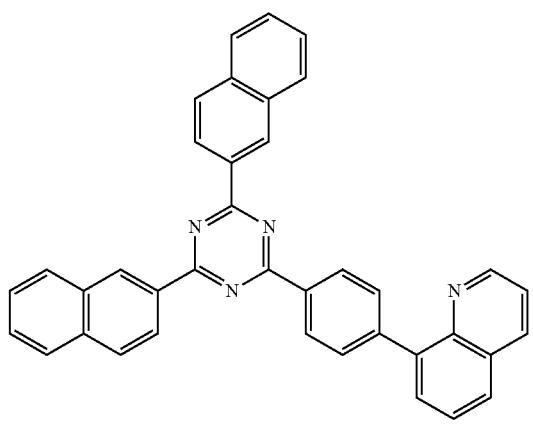

-continued

ET28

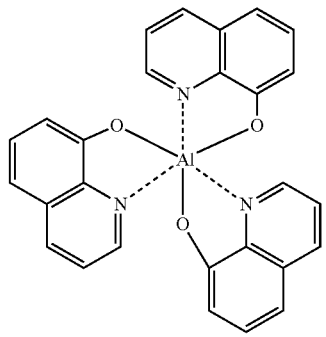

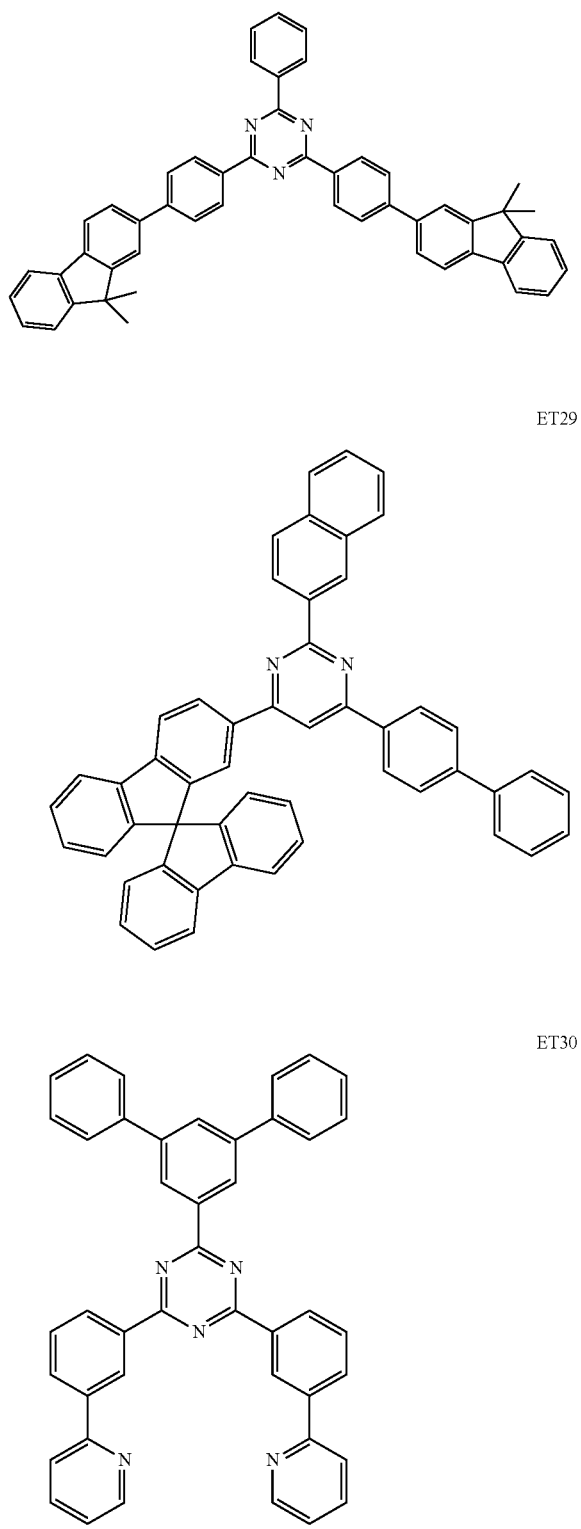

ET29

Alq₃

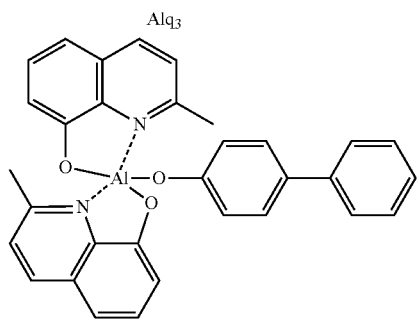

BAlq

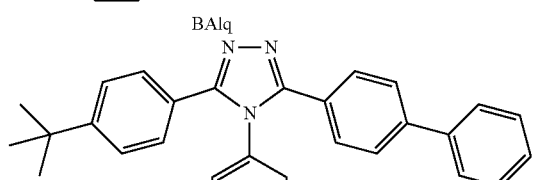

TAZ

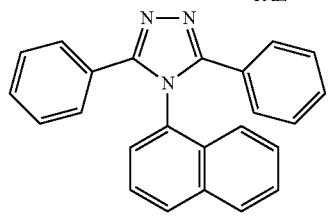

NTAZ

ET30

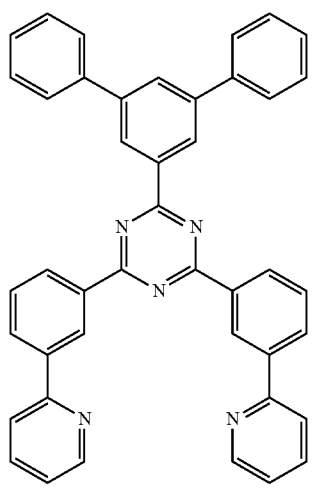

Alternatively, the electron transport region may include at least one selected from BCP (2,9-dimethyl-4,7-diphenyl-1,10-phenanthroline), BPhen (4,7-diphenyl-1,10-phenanthroline), Alq3, BAlq, TAZ (3-(biphenyl-4-yl)-5-(4-tert-butylphenyl)-4-phenyl-4H-1,2,4-triazole), and NTAZ.

The buffer layer, the hole blocking layer, or the electron adjusting layer may each independently have a thickness of about 20 Å to about 1000 Å, for example, about 30 Å to about 300 Å. When the thickness of the buffer layer, the hole blocking layer, or the electron adjusting layer satisfies the above-stated ranges, an excellent hole blocking characteristic or electron adjusting characteristic can be acquired without substantially increasing a driving voltage.

The thickness of the electron transport layer ETL may be about 100 Å to about 1000 Å, for example, about 150 Å to about 500 Å. When the thickness of the electron transport layer ETL satisfies the above-stated ranges, a satisfactory electron transport characteristic can be acquired without substantially increasing a driving voltage.

The electron transport region (e.g., the electron transport layer ETL in the electron transport region) may further include a metal-containing material in addition to the above-described materials.

The metal-containing material may include at least one selected from an alkali metal complex and an alkali earth metal complex. Metal ions in the alkali metal complex may be selected from Li ions, Na ions, K ions, Rb ions, and Cs ions, and metal ions of the alkali earth metal complex may be selected from Be ions, Mg ions, Ca ions, Sr ions, and Ba ions. The ligand coordinated to the metal ions of the alkali metal complex and the alkaline earth metal complex may be each independently selected from hydroxyquinoline, hydroxyisoquinoline, hydroxybenzoquinoline, hydroxyacridine, hydroxyphenanthridine, hydroxydiphenyl oxadiazole, hydroxydiphenyl thiadiazole, hydroxyphenyl pyridine, hydroxyphenyl benzoimidazole, hydroxyphenyl benzothiazole, bipyridine, phenanthroline, and cyclopentadiene, but the present invention is not limited thereto.

For example, the metal-containing material may include a Li complex. The Li complex may include, for example, a compound ET-D1 (lithium quinolate, LiQ) or ET-D2.

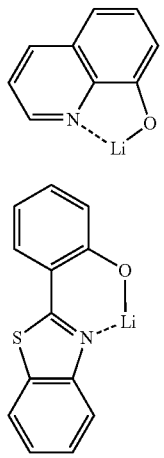

ET-D1

ET-D2

The electron transport region may include an electron injection layer that eases electron injection from the second electrode 190. The electron injection layer may directly contact the second electrode 190.

The electron injection layer may have i) a single-layered structure formed of a single layer made of a single material; ii) a single-layered structure formed of a single layer made of a plurality of different materials; or iii) a multi-layered structure formed of a plurality of layers formed of a plurality of different materials.

The electron injection layer may include a reducing dopant. The reducing dopant may include at least one selected from an alkali metal, an alkali earth metal, a rare earth metal, an alkali metal compound, an alkali earth metal compound, a rare earth metal compound, an alkali metal complex, an alkali earth metal complex, and a rare earth metal complex.

The alkali metal may be selected from Na, K, Rb, and Cs. According to an exemplary embodiment, the alkali metal may be K, Rb, or Cs. According to another exemplary embodiment, the alkali metal may be Rb or Cs, but the present invention is not limited thereto.

The alkali earth metal may be selected from Ca, Sr, and Ba. The rare earth metal may be selected from Sc, Y, Ce, Tb, Yb, Gd, and Tb. The alkali metal compound, the alkali earth metal compound, and the rare earth metal compound may be selected from an oxide of the alkali metal, the alkali earth metal, and the rare earth metal, and a halide (e.g., fluoride, chloride, bromide, iodide, and the like) of the alkali metal, the alkali earth metal, and the rare earth metal.

The alkali metal compound may be selected from an alkali metal oxide (such as $Li_2O$, $Cs_2O$, $K_2O$, and the like), and an alkali metal halide (such as LiF, NaF, CsF, KF, LiI, NaI, CsI, KI, and the like). According to an exemplary embodiment, the alkali metal compound may be selected from LiF, $Li_2O$, NaF, LiI, NaI, CsI, and KI, but the present invention is not limited thereto.

The alkali earth metal compound may be selected from alkali earth metal compounds such as BaO, SrO, CaO, $Ba_xSr_{1-x}O$ (0<x<1), $Ba_xCa_{1-x}O$ (0<x<1), and the like. According to an exemplary embodiment, the alkali earth metal compound may be selected from BaO, SrO, and CaO, but the present invention is not limited thereto.

The rare earth metal compound may be selected from $YbF_3$, $ScF_3$, $ScO_3$, $Y_2O_3$, $Ce_2O_3$, $GdF_3$, and $TbF_3$. According to an exemplary embodiment, the rare earth metal compound may be selected from $YbF_3$, $ScF_3$, $TbF_3$, $YbI_3$, $ScI_3$, and $TbI_3$, but the present invention is not limited thereto.

The alkali metal complex, the alkali earth metal complex, and the rare earth metal complex may include ions of the above-described alkali metal, alkali earth metal, and rare earth metal, and the ligand coordinate to the metal ion of the alkali metal complex, alkali earth metal complex, and rare earth metal complex may be independently selected from hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenyl thiadiazole, hydroxyphenylpyridine, hydroxyphenylbenzoimidazole, hydroxyphenylbenzothiazole, bipyridine, phenanthroline, and cyclopentadiene, but the present invention is not limited thereto.

The electron injection layer may be formed of only the above-described reducing dopant, or may further include an organic material in addition to the reducing dopant. When the electron injection layer includes the reducing dopant and the organic material, the reducing dopant may be evenly or unevenly dispersed in a matrix formed of the organic material.

The electron injection layer may have a thickness of about 1 Å to about 100 Å, for example, about 3 Å to about 90 Å. When the thickness of the electron injection layer satisfies such a range, a satisfactory electron injection characteristic can be acquired without a substantial increase of a driving voltage.

The second electrode 190 is disposed on the organic layer 150. The second electrode 190 may be a cathode, which is an electron injection electrode. As a material for the second electrode 190, a metal having a low work function, an alloy, an electrically conductive compound, and a mixture thereof may be utilized.

The second electrode 190 may include at least one selected from lithium (Li), magnesium (Mg), aluminum (Al), aluminum-lithium (Al—Li), calcium (Ca), magnesium-indium (Mg—In), magnesium-silver (Mg—Ag), ITO, and IZO, but the present invention is not limited thereto. The second electrode 190 may be a transmissive electrode, a transflective electrode, or a reflective electrode.

The second electrode 190 may have a single-layered structure of a single layer or a multi-layered structure of a plurality of layers.

Figure 2:
FIG. 2 is a schematic illustratration of a structure of an organic light emitting device according to an exemplary embodiment.
Figure 3:
FIG. 3 is a schematic illustratration of a structure of an organic light emitting device according to an exemplary embodiment.
Figure 4:
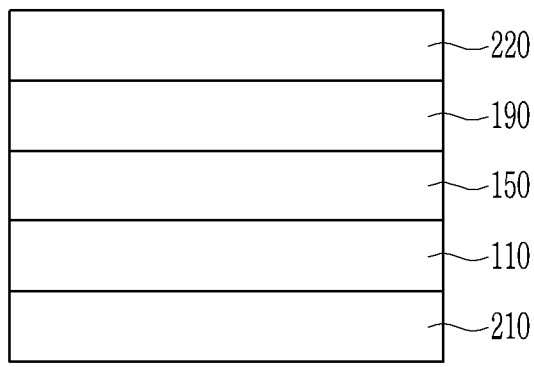
FIG. 4 is a schematic illustratration of a structure of an organic light emitting device according to an exemplary embodiment.

Meanwhile, the organic light emitting device of FIG. 2 has a structure in which a first capping layer 210, the first electrode 110, the organic layer 150, and the second electrode 190 are sequentially stacked; the organic light emitting device of FIG. 3 has a structure in which the first capping layer 210, the first electrode 110, the organic layer 150, and the second electrode 190 are sequentially stacked; and the organic light emitting device of FIG. 4 has a structure in which the first capping layer 210, the first electrode 110, the organic layer 150, the second electrode 190, and a second capping layer 220 are sequentially stacked.

Descriptions of the first electrode 110, the organic layer 150, and the second electrode 190 of FIG. 2 to FIG. 4 can be found in the description of FIG. 1.

Light generated from the emission layer of the organic layer 150 may be emitted to the outside through the first electrode 110, which is a transflective electrode or a transmissive electrode, and the first capping layer 210; and/or light generated from the emission layer of the organic layer 150 may be emitted to the outside through the second electrode 190, which is a transflective electrode or a transmissive electrode, and the second capping layer 220.

The first capping layer 210 and the second capping layer 220 may serve to improve external light emission efficiency based on constructive interference.

The first capping layer 210 and the second capping layer 220 may each independently be an organic capping layer formed of an organic material, an inorganic capping layer formed of an inorganic material, and a complex capping layer including an organic material and an inorganic material.

At least one of the first capping layer 210 and the second capping layer 220 may independently include at least one material selected from a carbocyclic compound, a heterocyclic compound, an amine-based compound, porphine derivatives, phthalocyanine derivatives, naphthalocyanine derivatives, an alkali metal complex, and an alkali earth metal complex. The carbocyclic compound, the heterocyclic compound, and the amine-based compound may be selectively substituted with a substituent including at least one selected from O, N, S, Se, Si, F, Cl, Br, and I. According to an exemplary embodiment, at least one of the first capping layer 210 and the second capping layer 220 may independently include an amine-based compound.

According to another exemplary embodiment, at least one of the first capping layer 210 and the second capping layer 220 may independently include a compound represented by Chemical Formula 201 and a compound represented by Chemical Formula 202.

According to still another exemplary embodiment, at least one of the first capping layer 210 and the second capping layer 220 may independently include a compound selected from compounds HT1 to HT43 and compounds CP1 to CP5, but the present invention is not limited thereto.

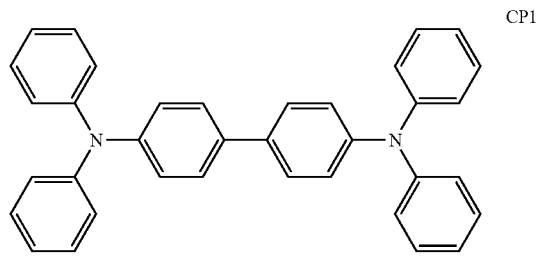

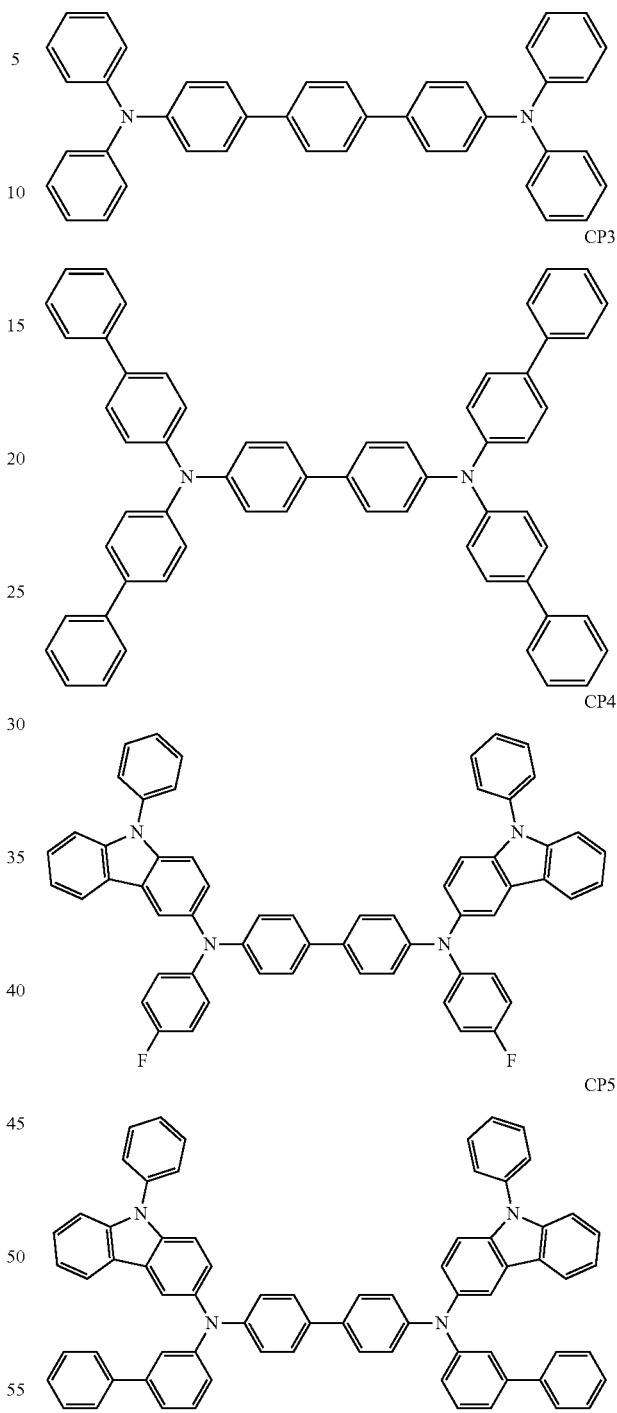

The organic light emitting device has been described with reference to FIG. 1 to FIG. 4, but the present invention is not limited thereto.

Each layer included in the hole transport region, the emission layer, and the hole transport region may be formed in a predetermined area utilizing various suitable methods such as vacuum deposition, spin coating, casting, a Lanmuir-Blodgett method, inkjet printing, laser printing, laser induced thermal imaging (LITI), and the like.

When the respective layers included in the hole transport region, the emission layer, and the electron transport region are formed by vacuum deposition, a deposition condition, for example, a deposition temperature, may be selected within a range of about 100° C. to about 500° C., a vacuum level may be selected within a range of about $10^{-8}$ torr to about $10^{-3}$ torr, and a deposition speed may be selected within a range of about 0.01 Å/s to about 100 Å/s in consideration of a compound to be included in a layer to be formed and a structure of the layer to be formed.

When the respective layers included in the hole transport region, the emission layer, and the respective layers included in the electron transport region are formed by spin coating, a coating condition, for example, a coating speed, may be selected within a range of about 2000 rpm to about 5000 rpm, and a heat treatment temperature may be selected within a range of about 80° C. to about 200° C. in consideration of a compound to be included in a layer to be formed and a structure of the layer to be formed.

Hereinafter, typical substituents among the substituents utilized in the present specification will be described (the number of carbon atoms defining the substituent is not limited and does not limit the characteristic of the substituent, and substituents not defined in this specification are as defined in the general definition).

In the present specification, a $C_1$-$C_{60}$ alkyl group may refer to a linear or branched monovalent aliphatic hydrocarbon group having 1 to 60 carbon atoms, and for example, a methyl group, an ethyl group, a propyl group, an isobutyl group, a sec-butyl group, a terbutyl group, a pentyl group, and the like are included. In the present specification, a $C_1$-$C_{60}$ alkylene group refers to a divalent group having the same (or substantially the same) structure as the $C_1$-$C_{60}$ alkyl group.

In the present specification, a $C_2$-$C_{60}$ alkenyl group refers to a hydrocarbon group including one or more double carbon bounds at a middle or end of the $C_2$-$C_{60}$ alkyl group, and includes, for example, an ethynyl group, a propenyl group, a butenyl group, and the like. In the present specification, a $C_2$-$C_{60}$ alkenylene group refers to a divalent group having the same (or substantially the same) structure as the $C_2$-$C_{60}$ alkenyl group.

In the present specification, a $C_2$-$C_{60}$ alkenyl group refers to one or more triple carbon bonds at a middle or end of the $C_2$-$C_{60}$ alkyl group, and includes, for example, an ethynyl group, a propynyl group, and the like. In the present specification, a $C_2$-$C_{60}$ alkenylene group refers to a divalent group having the same (or substantially the same) structure as the $C_2$-$C_{60}$ alkynyl group.

In the present specification, a $C_1$-$C_{60}$ alkoxy group refers to a monovalent group having a chemical formula of —$OA_{101}$ (where $A_{101}$ represents the $C_1$-$C_{60}$ alkyl group), and includes, for example, a methoxy group, an ethoxy group, an iso-propyloxy group, and the like.

In the present specification, a $C_3$-$C_{10}$ cycloalkyl group refers to a $C_1$ to $C_{10}$ monovalent saturated hydrocarbon monocyclic group, and for example, includes a cyclopropyl group, a cyclobutyl group, a cyclopentyl group, a cyclohexyl group, or a cycloheptyl group. In the present specification, the $C_3$-$C_{10}$ cycloalkylene group refers to a divalent group having the same (or substantially the same) structureas the $C_3$-$C_{10}$ cycloalkyl group.

In the present specification, a $C_1$-$C_{10}$ heterocycloalkyl group refers to a $C_1$ to $C_{10}$ monovalent monocyclic group including at least one heteroatom selected from N, O, Si, P, and S as a ring-forming atom, and includes, for example, a 1,2,3,4-oxatriazolidiny group, a tetrahydrofuranyl group, and a tetrahydrothiophenyl group. In the present specification, a $C_1$-$C_{10}$ heterocycloalkylene group refers to a divalent group having the same (or substantially the same) structure as the $C_1$-$C_{10}$ heterocycloalkyl group.

In the present specification, a $C_3$-$C_{10}$ cycloalkenyl group refers to a C1 to C3 monovalent monocyclic group that does not have aromaticity while having at least one double bond in a ring, and includes, for example, a cyclopentenyl group, a cyclohexenyl group, a cycloheptenyl group, and the like. In the present specification, a $C_3$-$C_{10}$ cycloalkenylene group refers to a divalent group having the same (or substantially the same) structure as the $C_3$-$C_{10}$ cycloalkenyl group.

In the present specification, a $C_1$-$C_{10}$ heterocycloalkenyl group refers to a C1 to C10 monocyclic group including at least one heteroatom selected from N, O, Si, P, and S as a ring-forming atom, and at least one double bond in a ring. The $C_1$-$C_{10}$ heterocycloalkenyl group includes, for example, a 4,5-dihydro-1,2,3,4-oxatriazolyl group, a 2,3-hyrofuranyl group, a 2,3-hydrothiophenyl group, and the like. In the present specification, a $C_1$-$C_{10}$ heterocycloalkenylene group refers to a divalent group having the same (or substantially the same) structure as the $C_1$-$C_{10}$ heterocycloalkenyl group.

In the present specification, a $C_6$-$C_{60}$ aryl group refers to a monovalent group having a C6 to C60 carbocyclic aromatic system, and a $C_6$-$C_{60}$ arylene group refers to a divalent group having a C6 to C60 carbocyclic aromatic system. The $C_6$-$C_{60}$ aryl group includes, for example, a phenyl group, a naphthyl group, an anthracenyl group, a phenanthrenyl group, a pyrenyl group, a glycenyl group, and the like. When the $C_6$-$C_{60}$ aryl group and the $C_6$-$C_{60}$ arylene group include two or more rings, the two or more rings may be condensed to each other.

In the present specification, a $C_1$-$C_{60}$ heteroaryl group refers to a monovalent group including at least one heteroatom selected from N, O, Si, P, and S as a ring-forming atom and having a C1 to C60 heterocyclic aromatic system, and a $C_1$-$C_{60}$ heteroarylene group refers to a divalent group having at least one heteroatom selected from N, O, Si, P, and S as a ring-forming atom and having a C1 to C60 heterocyclic aromatic system. The $C_1$-$C_{60}$ heteroaryl group includes, for example, a pyridinyl group, a pyrimidinyl group, a pyrazinyl group, a pyridazinyl group, a triazinyl group, a quinolinyl group, an isoquinolinyl group, and the like. When the $C_1$-$C_{60}$ heteroaryl group and the $C_1$-$C_{60}$ heteroarylene group include two or more rings, the two or more rings may be condensed to each other.

In the present specification, a $C_6$-$C_{60}$ aryloxy group may be represented by —$OA_{102}$ (where $A_{102}$ denotes the $C_6$-$C_{60}$ aryl group), and the $C_6$-$C_{60}$ arylthio group may be represented by —$SA_{103}$ (where $A_{103}$ denotes the $C_6$-$C_{60}$ aryl group).

In the specification, a monovalent non-aromatic condensed polycyclic group refers to a monovalent group having two or more rings condensed to each other, including only carbon as a ring-forming atom, and of which all molecules have non-aromaticity (e.g., having C8 to C60). The monovalent non-aromatic condensed polycyclic group includes, for example, a fluorenyl group. In the present specification, a divalent non-aromatic condensed polycyclic group refers to a divalent group having the same (or substantially the same) structure as the monovalent non-aromatic condensed polycyclic group.

In the present specification, the monovalent non-aromatic condensed polycyclic group refers to a monovalent group having two or more rings condensed to each other, including at least one heteroatom selected from N, O, Si, P, and S in addition to carbon atoms as a ring-forming atom, and of which all molecules have non-aromaticity (e.g., having C1 to C60). The monovalent non-aromatic condensed polycyclic group includes, for example, a carbazolyl group. In the present specification, the divalent non-aromatic condensed polycyclic group refers to a divalent group having the same (or substantially the same) structure as the monovalent non-aromatic condensed polycyclic group.

In the present specification, a $C_5$-$C_{60}$ carbocyclic group refers to a C5 to C60 monocyclic or polycyclic group including only carbon atoms as a ring-forming atom. The $C_5$-$C_{60}$ carbocyclic group may be an aromatic carbocyclic group or a non-aromatic carbocyclic group. The $C_5$-$C_{60}$ carbocyclic group may be a ring such as a benzene ring, a monovalent group such as a phenyl group, or a divalent group such as a phenylene group. Alternatively, depending on the number of substituents connected to the $C_5$-$C_{60}$ carbocyclic group, the $C_5$-$C_{60}$ carbocyclic group may be variously deformed to a trivalent group or a tetravalent group.

In the present specification, a $C_1$-$C_{60}$ heterocyclic group refers to a group having the same (or substantially the same) structure as the $C_5$-$C_{60}$ carbocyclic group, but includes at least one heteroatom selected from N, O, Si, P, and S in addition to carbon (may be C1 to C60) as a ring-forming atom.

In the present specification, at least one of the substituents of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic hetero-condensed polycyclic group is selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkynyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazino group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group, each substituted with one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)2($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may be independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic hetero-condensed polycyclic group, biphenyl group, and a terphenyl group.

In the present specification, "Ph" refers to a phenyl group, "Me" refers to a methyl group, "Et" refers to an ethyl group, "ter-Bu" or "Bu$^t$" refers to a tert-butyl group, and "OMe" refers to a methoxy group.

In the present specification, the term "biphenyl group" refers to a "phenyl group substituted with a phenyl group". The term "biphenyl group" is included in a "substituted phenyl group" of which a substituent is a "$C_6$-$C_{60}$ aryl group". In the present specification, the term "terphenyl group" refers to a "phenyl group substituted with a biphenyl group". The term "terphenyl group" is included in a "substituted phenyl group" of which a substituent is a "$C_6$-$C_{60}$ aryl group". In the present specification, "*" and "*'" each refers to a binding site with a neighboring atom in the corresponding chemical formula.

Figure 5:
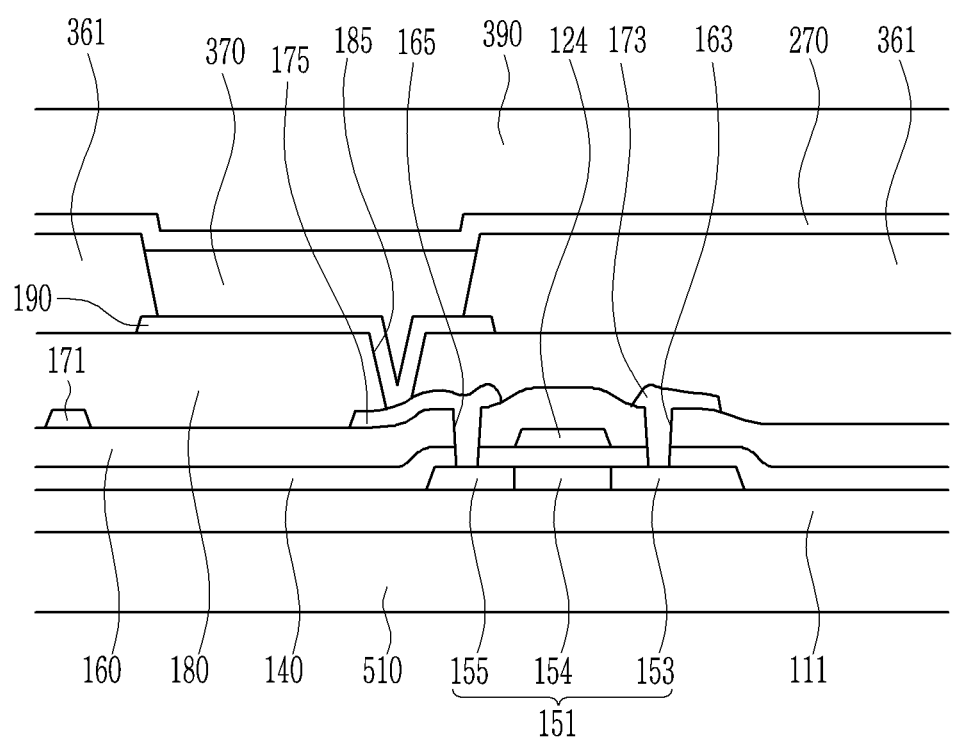
FIG. 5 is a partial cross-sectional view of a display device including the organic light emitting device of FIG. 1.

Next, a display device according to an exemplary embodiment will be described with reference to FIG. 5. FIG. 5 is a cross-sectional view of the display device according to the exemplary embodiment.

Referring to FIG. 5, a blocking layer 111 that is made of a silicon oxide or a silicon nitride is provided on a substrate 510.

A semiconductor layer 151 is provided on the blocking layer 111. The semiconductor layer 151 includes a source region 153 and a drain region 155 that are doped with an impurity, and a channel region 154 disposed between the source region 153 and the drain region 155.

A gate insulation layer 140 is disposed on the semiconductor layer 151 and the blocking layer 111, and may include a silicon oxide or a silicon nitride. A control electrode 124 overlaps the channel region 154 of the semiconductor layer 151, and is disposed on the gate insulation layer 140.

An interlayer insulation layer 160 is disposed on the control electrode 124 and the gate insulation layer 140. The interlayer insulation layer 160 includes a first contact hole 165 and a second contact hole 163.

A data conductor that includes a data line 171, an input electrode 173, and an output electrode 175 is disposed on an interlayer insulation layer 160.

The output electrode 175 is connected with the drain region 155 through the first contact hole 165. In addition, the input electrode 173 is connected with the source region 153 through the second contact hole 163.

A passivation layer 180 is disposed on the data conductors 171, 173, and 175 and the interlayer insulation layer 160, and the passivation layer 180 includes a contact hole 185.

The pixel electrode 190 is disposed on the passivation layer 180. The pixel electrode 190 is connected with the output electrode 175 through the contact hole 185. A barrier rib 361 is provided on the passivation layer 180. An emission element layer 370 is disposed to overlap with the pixel electrode 190, and a common electrode 270 is disposed to overlap with the emission element layer 370. A light emitting element includes the pixel electrode 190, the emission element layer 370, and the common electrode 270.

In this case, the pixel electrode 190 may be an anode, which is a hole injection electrode, and may correspond to the first electrode 110 described with reference to FIG. 1 to FIG. 4, and the common electrode 270 may be a cathode, which is an electron injection electrode, and may correspond to the second electrode 190 described with reference to FIG. 1 to FIG. 4. However, the present invention is not limited thereto. The pixel electrode 190 may be a cathode and the common electrode 270 may be an anode depending on a driving method of the display device.

The emission element layer 370 may include the organic layer 150 described with reference to FIG. 1, and thus a description of the organic layer 150 will not be repeated.

An encapsulation layer 390 is disposed to overlap with the common electrode 270. The encapsulation layer 390 may include an organic material or an inorganic material, and alternatively, the organic material and the inorganic material may be alternately stacked. The encapsulation layer 390 may protect the display device from external moisture, heat, and other pollutants.

The above-described structure of the display device is an example, and the light emitting diode according to an exemplary embodiment of the present disclosure may be applied to a display device having another structure.

Hereinafter, an effect of the present invention will be described with reference to exemplary embodiments and comparative examples.

In Exemplary Embodiment 1, a Corning 15 Ω/cm² 1200 Å ITO glass substrate was cut into a 50 mm×50 mm×0.7 mm size and ultrasonic wave-cleaned utilizing isopropyl alcohol and pure water for 5 minutes, and then the cleaned substrate was irradiated with ultraviolet (UV) light for 30 min and exposed to ozone such that an anode was prepared. The ITO glass substrate was provided to a vacuum deposition device.

A compound represented by HT22 and a compound represented by P1 at 3 wt % were deposited with a thickness of 100 Å on the substrate, and a known hole transport material was deposited thereon with a thickness of 600 Å such that a hole transport region was formed.

A blue fluorescent host and DPAVBi, which is a blue fluorescent dopant, were simultaneously deposited (e.g., co-deposited) with a weight ratio of 95:5 on the hole transport region such that an emission layer having a thickness of 20 nm was formed.

Next, a compound represented by Chemical Formula 6-1 and a compound represented by Chemical Formula 6-2 were vacuum deposited with a weight ratio of 1:1 on the emission layer such that an electron transport region having a thickness of 300 Å was formed.

LiQ, which is a halogenated alkali metal, was deposited with a thickness of 10 Å on an electron injection region such that an electron injection region was formed, and Al was vacuum-deposited with a thickness of 1000 Å such that a cathode was formed.

Chemical Formula 6-1

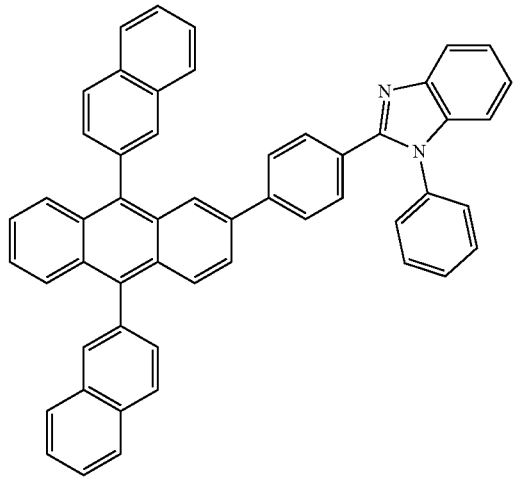

Chemical Formula 6-2

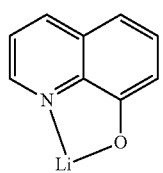

Exemplary Embodiment 2 is the same (or substantially the same) as Exemplary Embodiment 1, except that the compound represented by HT22 in Exemplary Embodiment 1 was replaced with a compound represented by HT37.

Exemplary Embodiment 3 is the same (or substantially the same) as Exemplary Embodiment 1, except that the compound represented by HT22 in Exemplary Embodiment 1 was replaced with a compound represented by HT39.

Comparative Example 1 is the same (or substantially the same) as Exemplary Embodiment 1, except that the compound represented by HT22 was replaced with a compound represented by HT1.

Exemplary Embodiments 1 to 3 and Comparative Example 1 are almost the same, except for a difference in a HOMO energy level of a hole transport material.

Exemplary Embodiments 1 to 3 and Comparative Example 1 will now be described with reference to Table 1. As in the exemplary embodiments of the present invention, when a doping content of a p-dopant exceeds 3 wt %, a difference between HOMO_HTM and LUMO_p-dopant (HOMO_HTM−LUMO_p-dopant) value may be less than −0.05. When Equation 1 is satisfied, light emission efficiency of an organic light emitting diode according to the exemplary embodiments is increased by up to 40% compared to Comparative Example 1 where Equation 1 is not satisfied.

According to the exemplary embodiment of the present invention, it is desirable for an amount of a p-dopant that increases an injection amount of holes to be low in order to control the injection amount of holes to the emission layer. However, as in Exemplary Embodiments 1 to 3 and Comparative Example 1, when a content of the p-dopant is somewhat high, energy required for hole movement is increased when Equation 1 is satisfied, and accordingly, the injection amount of holes to the emission layer can be appropriately controlled.

TABLE 1

| Organic light emitting device | HOMO_HTM (eV) | LUMO_p-dopant (eV) | HOMO_HTM − LUMO_p-dopant (eV) | Doping concentration (wt %) | Efficiency (cd/A) |
|---|---|---|---|---|---|
| Exemplary Embodiment 1 | −5.20 | −5.05 | −0.15 | 3 | 1.3 |
| Exemplary Embodiment 2 | −5.25 | −5.05 | −0.2 | 3 | 1.4 |
| Exemplary Embodiment 3 | −5.15 | −5.05 | −0.10 | 3 | 1.1 |
| Comparative Example 1 | −5.10 | −5.05 | −0.05 | 3 | 1.0 |

Exemplary Embodiment 4 is the same (or substantially the same) as Exemplary Embodiment 1, except that a hole transport region includes a compound represented by HT1 and a p-dopant is a compound represented by P2. Exemplary Embodiment 5 is the same (or substantially the same) as Exemplary Embodiment 4, except that a p-dopant is a compound represented by P3. Comparative Example 2 is the same as the Exemplary Embodiment 4, except that a p-dopant is represented by P1. Exemplary Embodiment 4, Exemplary Embodiment 5, and Comparative Example 2 have almost the same (or substantially the same) composition except for a difference in a LUMO energy level of a p-dopant.

Referring to Table 2, light emission efficiency was improved by about 30% in Exemplary Embodiment 4 and Exemplary Embodiment 5 compared to Comparative Example 2. The LUMO energy level of the p-dopant is high in Exemplary Embodiment 4 and Exemplary Embodiment 5 compared to Comparative Example 2. Accordingly, when HOMO energy of the hole transport material is consistent, a difference (i.e., an absolute value in the difference) between HOMO energy of the hole transport material and LUMO energy of the p-dopant may be increased depending on LUMO energy of the p-dopant. When the energy difference is increased, energy required for hole movement is increased, so that excessive injection of holes can be prevented or substantially prevented and an appropriate amount of holes can be supplied. Accordingly, it was determined that light emission efficiency of the organic light emitting device was increased.

Exemplary Embodiment 6 is the same (or substantially the same) as Exemplary Embodiment 1, except that a hole transport region includes a compound represented by HT1 and a p-dopant amount is 1.0%. Exemplary Embodiment 7 is the same (or substantially the same) as Exemplary Embodiment 6, except that a p-dopant amount is 0.5 wt %, and Exemplary Embodiment 8 is the same as (or substantially the same) Exemplary Embodiment 6, except that an injected amount of p-dopant is 0.25%. Comparative Example 3 is the same (or substantially the same) as Exemplary Embodiment 6, except that an injected amount of p-dopant is 3.0 wt %.

Referring to Table 3, efficiency of a light emission device was increased as the amount of p-dopant doped in the hole transport region according to Exemplary Embodiment 6 to Exemplary Embodiment 8 is decreased. As a doping amount of the p-dopant is increased, an injection amount of holes supplied to the emission layer is increased. According to the exemplary embodiment of the present invention, the injection amount of holes supplied to the emission layer is controlled as the injection amount of p-dopant is decreased, and accordingly, light efficiency was increased in the emission layer. That is, light emission efficiency can be increased by injecting an appropriate level of holes rather than injecting a large amount of holes.

TABLE 2

| Organic light emitting device | HOMO_HTM (eV) | LUMO_p-dopant (eV) | HOMO_HTM − LUMO_p-dopant (eV) | Doping concentration (wt %) | Efficiency (cd/A) |
|---|---|---|---|---|---|
| Exemplary Embodiment 4 | −5.10 | −5.01 | −0.09 | 3% | 1.3 |
| Exemplary Embodiment 5 | −5.10 | −4.99 | −0.11 | 3% | 1.35 |
| Comparative Example2 | −5.10 | −5.05 | −0.05 | 3% | 1.0 |

TABLE 3

| Organic light emitting device | HOMO_HTM (eV) | LUMO_p-dopant (eV) | HOMO_HTM − LUMO_p-dopant (eV) | Doping concentration (wt %) | Efficiency (cd/A) |
|---|---|---|---|---|---|
| Exemplary Embodiment 6 | −5.10 | −5.05 | −0.05 | 1.0% | 1.05 |
| Exemplary Embodiment 7 | −5.10 | −5.05 | −0.05 | 0.5% | 1.15 |
| Exemplary Embodiment 8 | −5.10 | −5.05 | −0.05 | 0.25% | 1.30 |
| Comparative Example 3 | −5.10 | −5.05 | −0.05 | 3% | 1.0 |

Exemplary Embodiment 9 is the same (or substantially the same) as Exemplary Embodiment 1, except that a hole transport region that includes a compound represented by HT1 and a p-dopant has a thickness of 50 Å, Exemplary Embodiment 10 is the same (or substantially the same) as Exemplary Embodiment 9, except that a hole transport region including a p-dopant has a thickness of 30 Å, and Comparative Example 4 is the same (or substantially the same) as Exemplary Embodiment 9, except that a hole transport region including a p-dopant has a thickness of 100 Å.

Referring to Table 4, it can be determined that as a thickness of a hole transport region including a p-dopant is decreased, light emission efficiency is increased. When a hole transport region including a p-dopant has a thick thickness, an injection amount of holes supplied to an emission layer is increased. However, it can be determined that when a hole transport region having a thin thickness is provided as in the exemplary embodiment of the present invention, rather than injecting a large amount of holes to the emission layer, an appropriate level of holes are injected, thereby increasing light efficiency.

TABLE 4

| Organic light emitting device | HOMO_HTM (eV) | LUMO_p-dopant (eV) | HOMO_HTM-LUMO_p-dopant (eV) | Doping concentration (wt %) | Efficiency (cd/A) | Organic light emitting device |
|---|---|---|---|---|---|---|
| Exemplary Embodiment 9 | −5.10 | −5.05 | −0.05 | 0.5% | 50 | 1.20 |
| Exemplary Embodiment 10 | −5.10 | −5.05 | −0.05 | 0.5% | 30 | 1.40 |
| Comparative Example 4 | −5.10 | −5.05 | −0.05 | 0.5% | 100 | 1.15 |

According to the above-described exemplary embodiments, the doping concentration of the p-dopant supplied to the hole transport region and the thickness of the hole transport region that includes the p-dopant are controlled to adjust an injection amount of holes supplied to the emission layer, thereby increasing light emission efficiency of the organic light emitting device. In addition, regardless of the doping concentration and the thickness of the hole transport region, energy levels of the hole transport material and the p-dopant are adjusted to prevent or substantially prevent an excessive amount of holes from being injected into the emission layer, thereby supplying an appropriate level of holes. Accordingly, the organic light emitting device can provide improved light efficiency.

Figure 6:
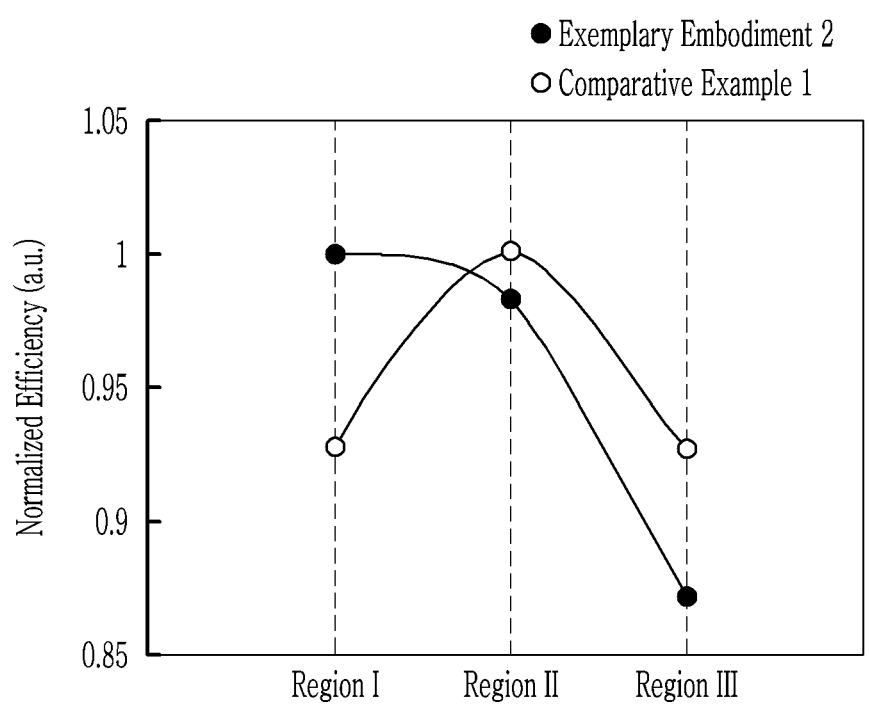
FIG. 6 is a graph illustrating light emission efficiency according to a doping region in an emission layer.

Hereinafter, light emission efficiency in region I to region III according to an exemplary embodiment and a comparative example will be described with reference to FIG. 6. FIG. 6 is a graph illustrating light emission efficiency according to a doping region in an emission layer. Specifically, an emission layer is divided into three regions according to a thickness direction, and light emission efficiency of each region is observed by doping a dopant (e.g., a light-emitting dopant) only to each region. Region 1 is a region adjacent to the hole transport region in the emission layer, region III is a region adjacent to a second electrode in the emission layer, and region II is a region disposed between region I and region III. In the present specification, the term "light emission region" refers to a region where light emission predominates by combination of electrons and holes.

It can be determined that in the case of the light emitting device according to Comparative Example 1, the light emission region is disposed in a center (i.e., region II) in the emission layer, but in the case of the light emitting device according to Exemplary Embodiment 2, the light emission region is formed in region I that is adjacent to the hole transport region.

It can also be determined that, in the case of the light emitting device according to the exemplary embodiment, the light emission region moves to a region adjacent to the hole transport region depending on hole injection control, and as the light emission region is further densified, the probability of the hole and the electron meeting within the light emission region is increased, so that the probability of formation of the exciton in the emission layer is increased. When the probability of formation of the exciton in the emission layer is increased, a large amount of excitons generated from the host is energy-transferred to a dopant, thereby achieving higher light efficiency. The limitation of the hole injection is consequently effective in densifying the light emitting region in the emission layer and consequently increasing the efficiency of the light emitting device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME OF THE SYMBOLS

110: first electrode
150: organic layer
190: second electrode
210: first capping layer
220: second capping layer

What is claimed is:

1. An organic light emitting device comprising:
   a first electrode;
   a second electrode that overlaps the first electrode; and
   an organic layer between the first electrode and the second electrode,
   wherein the organic layer comprises a hole transport region, the hole transport region comprising a hole transport material and a p-dopant,
   wherein when the doping amount of the p-dopant is less than 1 wt %, the following Equation 2 is satisfied:

$$\text{HOMO\_HTM} - \text{LUMO\_}p\text{-dopant} > -0.05 \text{ eV} \quad [\text{Equation 2}]$$

wherein, in Equation 2, HOMO_HTM denotes HOMO energy of the hole transport material and LUMO_p-dopant denotes LUMO energy of the p-dopant.

2. The organic light emitting device of claim 1, wherein the hole transport material satisfies $-5.3 \text{ eV} < \text{HOMO\_HTM} < -4.9 \text{ eV}$, and the p-dopant satisfies $-5.25 \text{ eV} < \text{LUMO\_p-dopant} < -4.85 \text{ eV}$.

3. The organic light emitting device of claim 1, wherein the p-dopant is included at an amount of about 0.25 wt % to about 1 wt % based on a total weight of the hole transport region.

4. The organic light emitting device of claim 1, wherein a thickness of the hole transport region comprising the p-dopant is about 10 Å to about 300 Å.

5. The organic light emitting device of claim 1, wherein the organic layer further comprises an emission layer, and recombination of holes and electrons in the emission layer is generated adjacent to the hole transport region.

6. The organic light emitting device of claim 1, wherein when the doping amount of the p-dopant is 1 wt % or less than 1 wt %, and when a doping concentration of the p-dopant is decreased, light emission efficiency of the organic light emitting device is increased.

7. The organic light emitting device of claim 1, wherein light emission efficiency of the organic light emitting device is increased as a thickness of the hole transport region that includes the p-dopant is decreased.

8. The organic light emitting device of claim 1, wherein the p-dopant is selected from the group consisting of a metal oxide, tetracyanoquinodimethane (TCNQ), 1,4,5,8,9,11-hexaazatriphenylene-hexacarbonitrile (HAT-CN), Chemical Formula P1 to Chemical Formula P18, and a compound represented by Chemical Formula 221, Chemical Formula 221

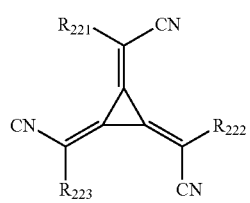

P1

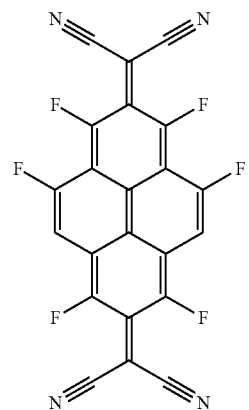

P2

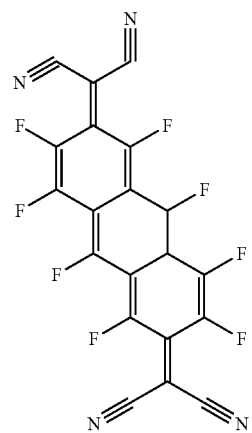

P3

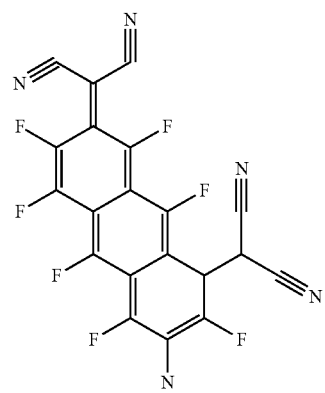

P4

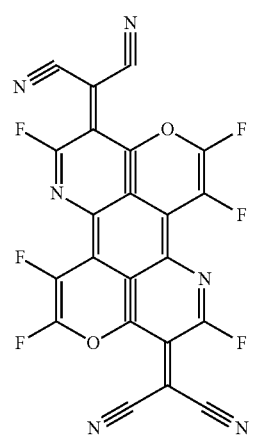

-continued
P5
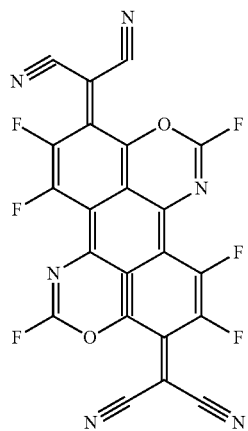
P6
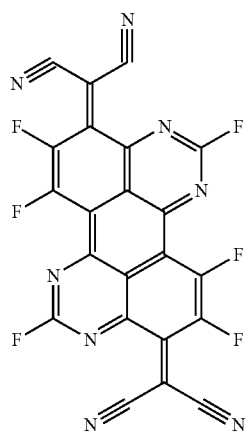
P7
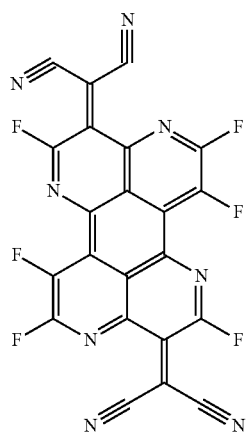
P8
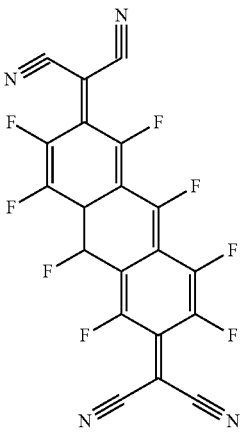
P9
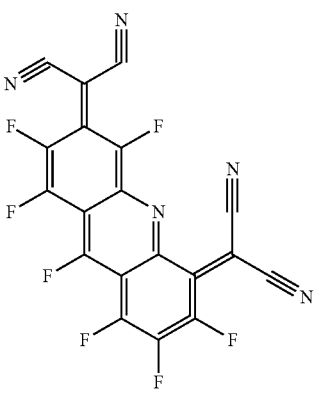
P10
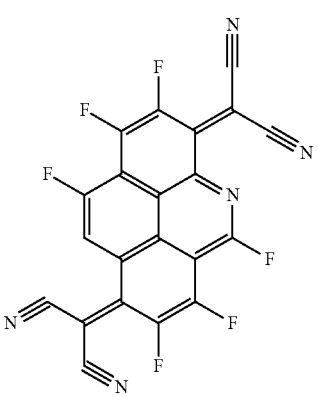
P11
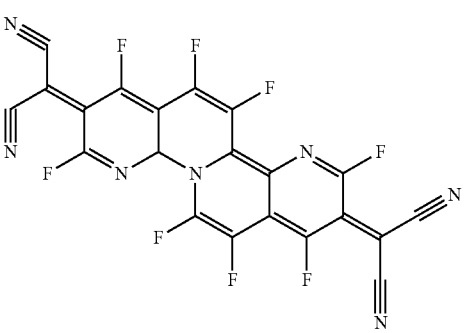

P12

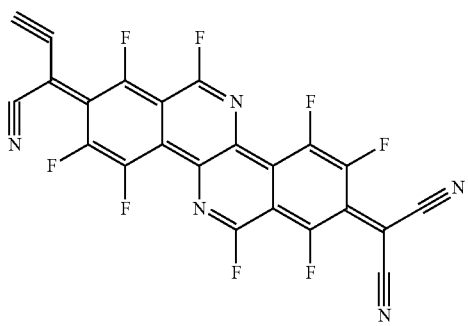

P13

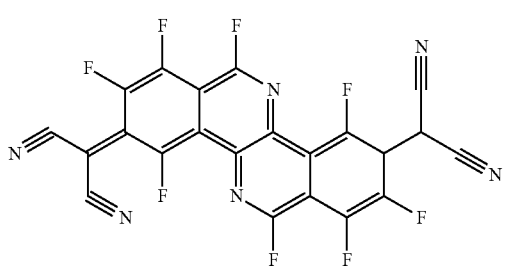

P14

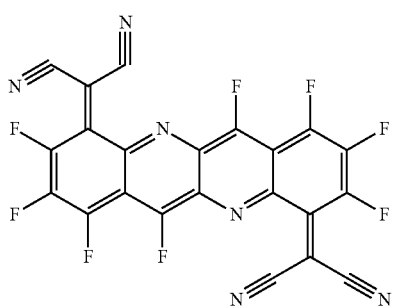

P15

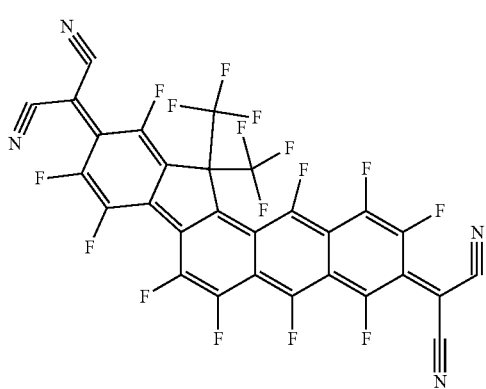

P16

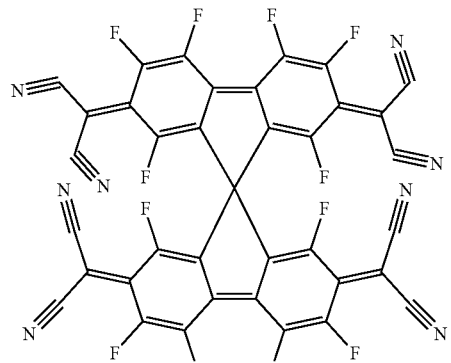

P17

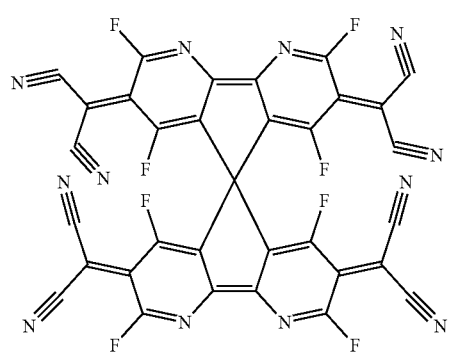

P18

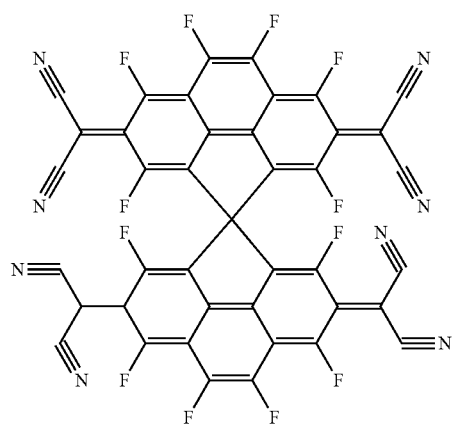

wherein in Chemical Formula 221, $R_{221}$ to $R_{223}$ are each independently selected from the group consisting of a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group, and at least one of $R_{221}$ to $R_{223}$ has at least one selected from a cyano group; a $C_1$-$C_{20}$ alkyl group substituted with —F, —Cl, —Br, or —I; a $C_1$-$C_{20}$ alkyl group substituted with —Cl; a $C_1$-$C_{20}$ alkyl group substituted with Br; and a $C_1$-$C_{20}$ alkyl group substituted with —I.

\* \* \* \* \*